United States Patent
Lee et al.

(10) Patent No.: US 10,904,780 B2
(45) Date of Patent: Jan. 26, 2021

(54) METHOD AND APPARATUS FOR MEASURING CHANNEL STATUS IN WIRELESS COMMUNICATION SYSTEM SUPPORTING RECONFIGURATION OF USAGE OF RADIO RESOURCE

(71) Applicant: LG ELECTRONICS INC., Seoul (KR)

(72) Inventors: Seungmin Lee, Seoul (KR); Hanbyul Seo, Seoul (KR); Inkwon Seo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/903,235

(22) PCT Filed: Jul. 9, 2014

(86) PCT No.: PCT/KR2014/006166
§ 371 (c)(1),
(2) Date: Jan. 6, 2016

(87) PCT Pub. No.: WO2015/005678
PCT Pub. Date: Jan. 15, 2015

(65) Prior Publication Data
US 2016/0135070 A1    May 12, 2016

Related U.S. Application Data

(60) Provisional application No. 61/844,380, filed on Jul. 9, 2013.

(51) Int. Cl.
*H04W 24/08*  (2009.01)
*H04L 1/00*   (2006.01)
(Continued)

(52) U.S. Cl.
CPC ........... *H04W 24/08* (2013.01); *H03M 13/09* (2013.01); *H04L 1/0026* (2013.01);
(Continued)

(58) Field of Classification Search
USPC .................................................. 370/252, 236
See application file for complete search history.

(56) References Cited

U.S. PATENT DOCUMENTS

2010/0074188 A1* 3/2010 Hsu ..................... H04W 56/00
                                                    370/329
2010/0173641 A1* 7/2010 Kim ..................... H04L 5/0026
                                                    455/450
(Continued)

FOREIGN PATENT DOCUMENTS

CN       101895903        11/2010
KR     10-2009-0055900     6/2009
(Continued)

OTHER PUBLICATIONS

Eriksson—U.S. Appl. No. 61/821,800, filed May 10, 2013 (Year: 2013).*
(Continued)

*Primary Examiner* — Kodzovi Acolatse
*Assistant Examiner* — The Hy Nguyen
(74) *Attorney, Agent, or Firm* — Lee Hong Degerman Kang Waimey

(57) ABSTRACT

The present invention relates to a method and apparatus for measuring channel status information on a terminal in a wireless communication system that supports the change of usage of a radio resource. In particular, the method includes the steps of: receiving a change of usage message for a dynamic change in the usage of a radio resource; and measuring channel status information (CSI) from a CSI reference resource, wherein the CSI reference resource is
(Continued)

arranged on a time section at which a usage of a radio resource is determined by the change of usage message, and determined based on only an uplink-downlink setting on a system information block (SIB) when the reception of the change of usage message is unsuccessful.

8 Claims, 13 Drawing Sheets

(51) Int. Cl.
    *H04L 5/00* (2006.01)
    *H03M 13/09* (2006.01)
    *H04L 5/14* (2006.01)
    *H04W 72/00* (2009.01)

(52) U.S. Cl.
    CPC .......... *H04L 1/0027* (2013.01); *H04L 5/0053* (2013.01); *H04L 5/0057* (2013.01); *H04L 5/0085* (2013.01); *H04L 5/0091* (2013.01); *H04L 5/1469* (2013.01); *H04L 5/001* (2013.01); *H04L 5/0023* (2013.01); *H04W 72/00* (2013.01)

(56) References Cited

U.S. PATENT DOCUMENTS

| | | | | |
|---|---|---|---|---|
| 2011/0200137 A1* | 8/2011 | Han | ....................... | H04L 5/0048 375/295 |
| 2012/0120903 A1* | 5/2012 | Kim | ....................... | H04B 7/024 370/329 |
| 2013/0044652 A1* | 2/2013 | Wang | ....................... | H04L 1/08 370/280 |
| 2013/0142134 A1* | 6/2013 | Zhu | ....................... | H04L 5/001 370/329 |
| 2014/0241149 A1* | 8/2014 | Liu | ....................... | H04W 24/02 370/228 |
| 2014/0334355 A1* | 11/2014 | Ekpenyong | ............... | H04B 1/56 370/280 |
| 2015/0358137 A1* | 12/2015 | Chae | .................... | H04W 74/006 370/329 |
| 2016/0044663 A1* | 2/2016 | Yao | ....................... | H04W 80/00 370/336 |
| 2016/0072612 A1* | 3/2016 | Seo | .......................... | H04L 1/22 370/329 |
| 2016/0087762 A1* | 3/2016 | Eriksson | ............... | H04L 1/0006 370/280 |
| 2016/0105248 A1* | 4/2016 | Lunttila | ............... | H04B 17/345 370/252 |
| 2016/0149687 A1* | 5/2016 | Lei | ....................... | H04W 16/10 370/280 |

FOREIGN PATENT DOCUMENTS

| | | |
|---|---|---|
| KR | 10-2011-0023051 | 3/2011 |
| KR | 10-2012-0068858 | 6/2012 |
| KR | 10-2013-0071485 | 6/2013 |
| WO | 2012/067442 | 5/2012 |
| WO | 2012/124923 | 9/2012 |
| WO | 2012/128490 | 9/2012 |

OTHER PUBLICATIONS

PCT International Application No. PCT/KR2014/006166, Written Opinion of the International Searching Authority dated Oct. 24, 2014, 16 pages.

State Intellectual Property Office of the People's Republic of China Application Serial No. 201480039524.X, Office Action dated Jun. 4, 2018, 12 pages.

LG Electronics, "TDD DL-UL Reconfiguration Methods for eIMTA", R1-122318, 3GPP TSG RAN WG1 Meeting #69, May 2012, 5 pages.

* cited by examiner

-PRIOR ART- (a) Control-plane protocol stack (b) User-plane protocol stack

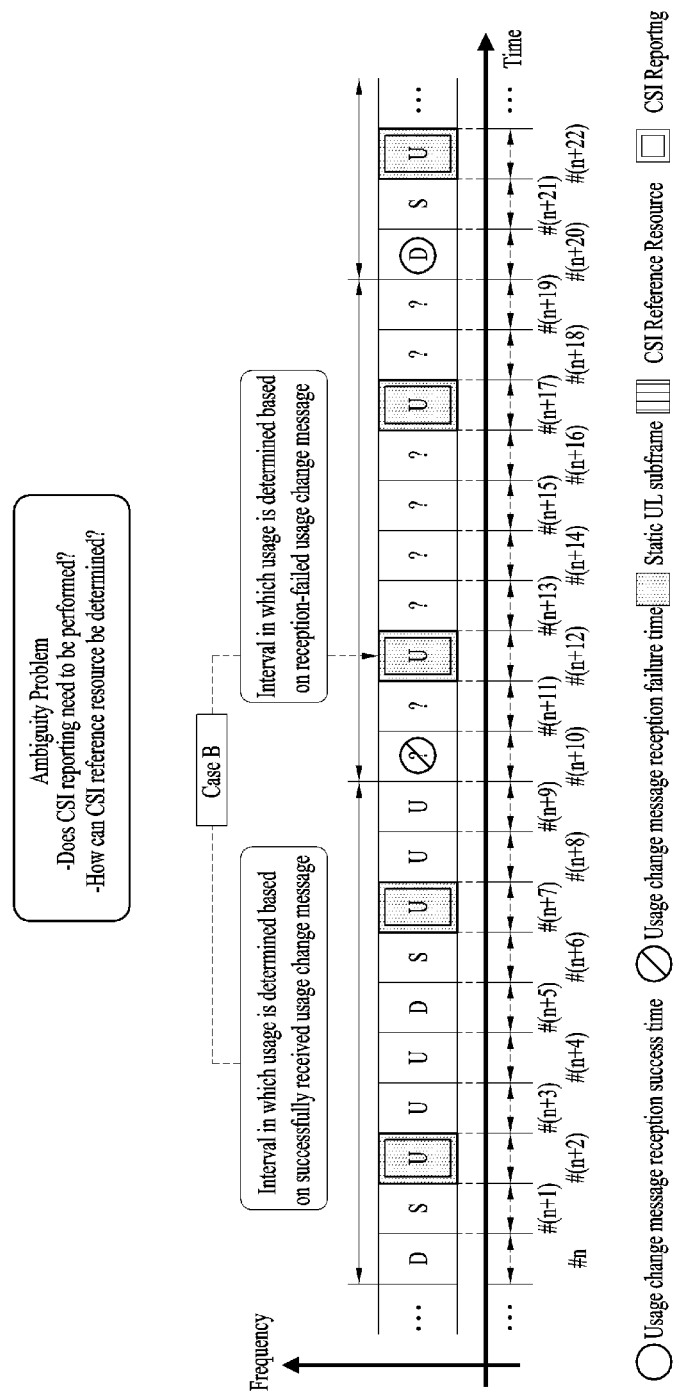
FIG. 9B -PRIOR ARTns
METHOD AND APPARATUS FOR MEASURING CHANNEL STATUS IN WIRELESS COMMUNICATION SYSTEM SUPPORTING RECONFIGURATION OF USAGE OF RADIO RESOURCE

CROSS-REFERENCE TO RELATED APPLICATIONS

This application is the National Stage filing under 35 U.S.C. 371 of International Application No. PCT/KR2014/006166, filed on Jul. 9, 2014, which claims the benefit of U.S. Provisional Application No. 61/844,380, filed on Jul. 9, 2013, the contents of which are all hereby incorporated by reference herein in their entirety.

TECHNICAL FIELD

The present invention relates to a wireless communication system, and more particularly, to a method and apparatus for measuring a channel state in a wireless communication system supporting a change of usage of a radio resource.

BACKGROUND ART

A 3rd generation partnership project long term evolution (3GPP LTE) (hereinafter, referred to as 'LTE') communication system which is an example of a wireless communication system to which the present invention can be applied will be described in brief.

FIG. 1 is a diagram illustrating a network structure of an Evolved Universal Mobile Telecommunications System (E-UMTS) which is an example of a wireless communication system. The E-UMTS is an evolved version of the conventional UMTS, and its basic standardization is in progress under the 3rd Generation Partnership Project (3GPP). The E-UMTS may be referred to as a Long Term Evolution (LTE) system. Details of the technical specifications of the UMTS and E-UMTS may be understood with reference to Release 7 and Release 8 of "3rd Generation Partnership Project; Technical Specification Group Radio Access Network".

Referring to FIG. 1, the E-UMTS includes a User Equipment (UE), base stations (eNode B; eNB), and an Access Gateway (AG) which is located at an end of a network (E-UTRAN) and connected to an external network. The base stations may simultaneously transmit multiple data streams for a broadcast service, a multicast service and/or a unicast service.

One or more cells exist for one base station. One cell is set to one of bandwidths of 1.44, 3, 5, 10, 15 and 20 MHz to provide a downlink or uplink transport service to several user equipments. Different cells may be set to provide different bandwidths. Also, one base station controls data transmission and reception for a plurality of user equipments. The base station transmits downlink (DL) scheduling information of downlink data to the corresponding user equipment to notify the corresponding user equipment of time and frequency domains to which data will be transmitted and information related to encoding, data size, and hybrid automatic repeat and request (HARQ). Also, the base station transmits uplink (UL) scheduling information of uplink data to the corresponding user equipment to notify the corresponding user equipment of time and frequency domains that can be used by the corresponding user equipment, and information related to encoding, data size, and HARQ. An interface for transmitting user traffic or control traffic may be used between the base stations. A Core Network (CN) may include the AG and a network node or the like for user registration of the user equipment. The AG manages mobility of the user equipment on a Tracking Area (TA) basis, wherein one TA includes a plurality of cells.

Although the wireless communication technology developed based on WCDMA has been evolved into LTE, request and expectation of users and providers have continued to increase. Also, since another wireless access technology is being continuously developed, new evolution of the wireless communication technology will be required for competitiveness in the future. In this respect, reduction of cost per bit, increase of available service, use of adaptable frequency band, simple structure and open type interface, proper power consumption of the user equipment, etc. are required.

In order to support efficient management of a wireless communication system of a base station, a user equipment periodically and/or aperiodically reports state information of a current channel to the base station. Since the reported channel state information may include results calculated by considering a variety of situations, more efficient reporting method is required.

DISCLOSURE OF THE INVENTION

Technical Task

Based on the above-described discussion, a method of measuring a channel state in a wireless communication system supporting a usage change of a radio resource and apparatus therefor will hereinafter be proposed Technical tasks obtainable from the present invention are non-limited by the above-mentioned technical task. And, other unmentioned technical tasks can be clearly understood from the following description by those having ordinary skill in the technical field to which the present invention pertains.

Technical Solutions

In a $1^{st}$ technical aspect of the present invention, provided herein is a method of measuring CSI (channel state information), which is measured by a user equipment in a wireless communication system supporting a change of radio resource usage, including the steps of receiving a usage change message for a dynamic change of the radio resource usage and measuring the CSI from a CSI-reference resource, wherein the CSI-reference resource is located in a time interval in which the radio resource usage is determined by the usage change message and wherein if reception of the usage change message fails, the CSI-reference resource is determined based on only a UL-DL (uplink-downlink) configuration on a SIB (system information block).

Preferably, if reception of the usage change message is successful, the CSI-reference resource may be determined based on only a UL-DL configuration configured by the usage change message.

Preferably, the CSI-reference resource may correspond to at least one of a downlink subframe and a special subframe.

Preferably, if the reception of the usage change message fails, a radio resource not corresponding to the CSI-reference resource determined based on the UL-DL configuration on the SIB may be determined as a non-valid CSI-reference resource.

Preferably, the time interval may be determined according to a starting time point and a time window size received from a base station.

In a 2$^{nd}$ technical aspect of the present invention, provided herein is a user equipment for measuring CSI (channel state information) in a wireless communication system supporting a change of radio resource usage, including a radio frequency unit and a processor configured to receive a usage change message for a dynamic change of the radio resource usage and to measure the CSI from a CSI-reference resource, wherein the CSI-reference resource is located in a time interval in which the radio resource usage is determined by the usage change message and wherein if reception of the usage change message fails, the CSI-reference resource is determined based on only a UL-DL (uplink-downlink) configuration on a SIB (system information block).

Advantageous Effects

According to an embodiment of the present invention, channel state measurement in a wireless communication system supporting a usage change of a radio resource can be efficiently supported.

Effects obtainable from the present invention are non-limited by the above mentioned effect. And, other unmentioned effects can be clearly understood from the following description by those having ordinary skill in the technical field to which the present invention pertains.

DESCRIPTION OF DRAWINGS

The accompanying drawings, which are included to provide a further understanding of the invention and are incorporated in and constitute a part of this specification, illustrate embodiments of the invention and together with the description serve to explain the principles of the invention.

BEST MODE FOR INVENTION

The following technology may be used for various wireless access technologies such as CDMA (code division multiple access), FDMA (frequency division multiple access), TDMA (time division multiple access), OFDMA (orthogonal frequency division multiple access), and SC-FDMA (single carrier frequency division multiple access). The CDMA may be implemented by the radio technology such as UTRA (universal terrestrial radio access) or CDMA2000. The TDMA may be implemented by the radio technology such as global system for mobile communications (GSM)/general packet radio service (GPRS)/enhanced data rates for GSM evolution (EDGE). The OFDMA may be implemented by the radio technology such as IEEE 802.11 (Wi-Fi), IEEE 802.16 (WiMAX), IEEE 802.20, and evolved UTRA (E-UTRA). The UTRA is a part of a universal mobile telecommunications system (UMTS). A 3rd generation partnership project long term evolution (3GPP LTE) is a part of an evolved UMTS (E-UMTS) that uses E-UTRA, and adopts OFDMA in a downlink and SC-FDMA in an uplink. LTE-advanced (LTE-A) is an evolved version of the 3GPP LTE.

For clarification of the description, although the following embodiments will be described based on the 3GPP LTE/LTE-A, it is to be understood that the technical spirits of the present invention are not limited to the 3GPP LTE/LTE-A. Also, specific terminologies hereinafter used in the embodiments of the present invention are provided to assist understanding of the present invention, and various modifications may be made in the specific terminologies within the range that they do not depart from technical spirits of the present invention.

Figure 1:
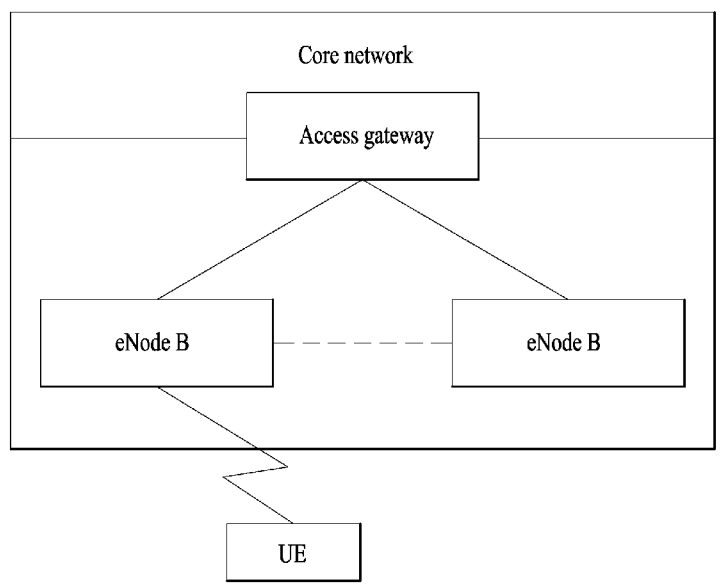
FIG. 1 is a schematic diagram of E-UMTS network structure as one example of a wireless communication system.
Figure 2:
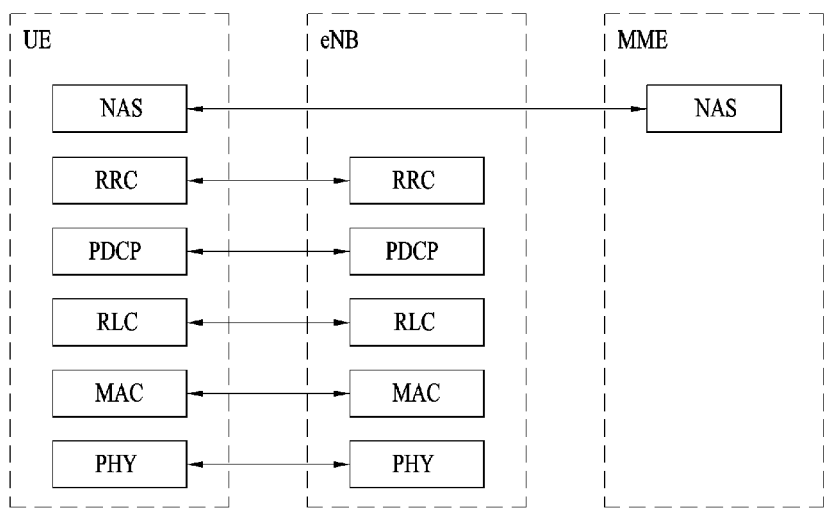
FIG. 2 is a diagram for structures of control and user planes of a radio interface protocol between a user equipment and E-UTRAN based on 3GPP radio access network standard.
Figure 2:
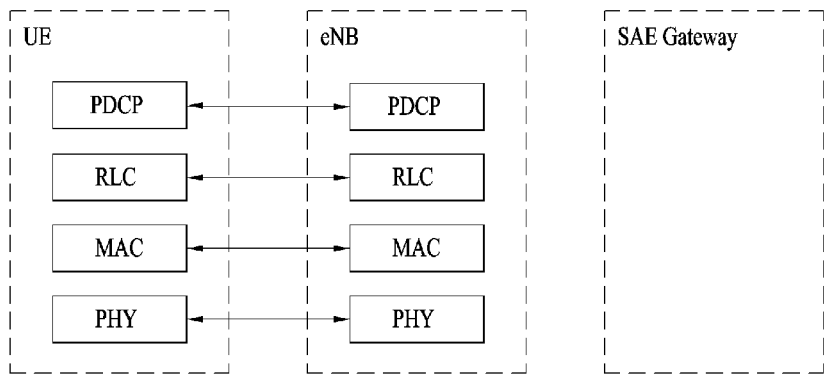

FIG. 2 is a diagram illustrating structures of a control plane and a user plane of a radio interface protocol between a user equipment and E-UTRAN based on the 3GPP radio access network standard. The control plane means a passageway where control messages are transmitted, wherein the control messages are used by the user equipment and the network to manage call. The user plane means a passageway where data generated in an application layer, for example, voice data or Internet packet data are transmitted.

A physical layer as the first layer provides an information transfer service to an upper layer using a physical channel. The physical layer is connected to a medium access control (MAC) layer via a transport channel, wherein the medium access control layer is located above the physical layer. Data are transferred between the medium access control layer and the physical layer via the transport channel. Data are transferred between one physical layer of a transmitting side and the other physical layer of a receiving side via the physical channel. The physical channel uses time and frequency as radio resources. In more detail, the physical channel is modulated in accordance with an orthogonal frequency division multiple access (OFDMA) scheme in a downlink, and is modulated in accordance with a single carrier frequency division multiple access (SC-FDMA) scheme in an uplink.

A medium access control (MAC) layer of the second layer provides a service to a radio link control (RLC) layer above the MAC layer via a logical channel. The RLC layer of the second layer supports reliable data transmission. The RLC layer may be implemented as a functional block inside the MAC layer. In order to effectively transmit data using IP packets such as IPv4 or IPv6 within a radio interface having a narrow bandwidth, a packet data convergence protocol (PDCP) layer of the second layer performs header compression to reduce the size of unnecessary control information.

A radio resource control (RRC) layer located on the lowest part of the third layer is defined in the control plane only. The RRC layer is associated with configuration, re-configuration and release of radio bearers ('RBs') to be in charge of controlling the logical, transport and physical channels. In this case, the RB means a service provided by the second layer for the data transfer between the user equipment and the network. To this end, the RRC layers of the user equipment and the network exchange RRC message with each other. If the RRC layer of the user equipment is RRC connected with the RRC layer of the network, the user equipment is in an RRC connected mode. If not so, the user equipment is in an RRC idle mode. A non-access stratum (NAS) layer located above the RRC layer performs functions such as session management and mobility management.

One cell constituting a base station eNB is set to one of bandwidths of 1.4, 3.5, 5, 10, 15, and 20 MHz and provides a downlink or uplink transmission service to several user equipments. At this time, different cells may be set to provide different bandwidths.

As downlink transport channels carrying data from the network to the user equipment, there are provided a broadcast channel (BCH) carrying system information, a paging channel (PCH) carrying paging message, and a downlink shared channel (SCH) carrying user traffic or control messages. Traffic or control messages of a downlink multicast or broadcast service may be transmitted via the downlink SCH or an additional downlink multicast channel (MCH). Meanwhile, as uplink transport channels carrying data from the user equipment to the network, there are provided a random access channel (RACH) carrying an initial control message and an uplink shared channel (UL-SCH) carrying user traffic or control message. As logical channels located above the transport channels and mapped with the transport channels, there are provided a broadcast control channel (BCCH), a paging control channel (PCCH), a common control channel (CCCH), a multicast control channel (MCCH), and a multicast traffic channel (MTCH).

Figure 3:
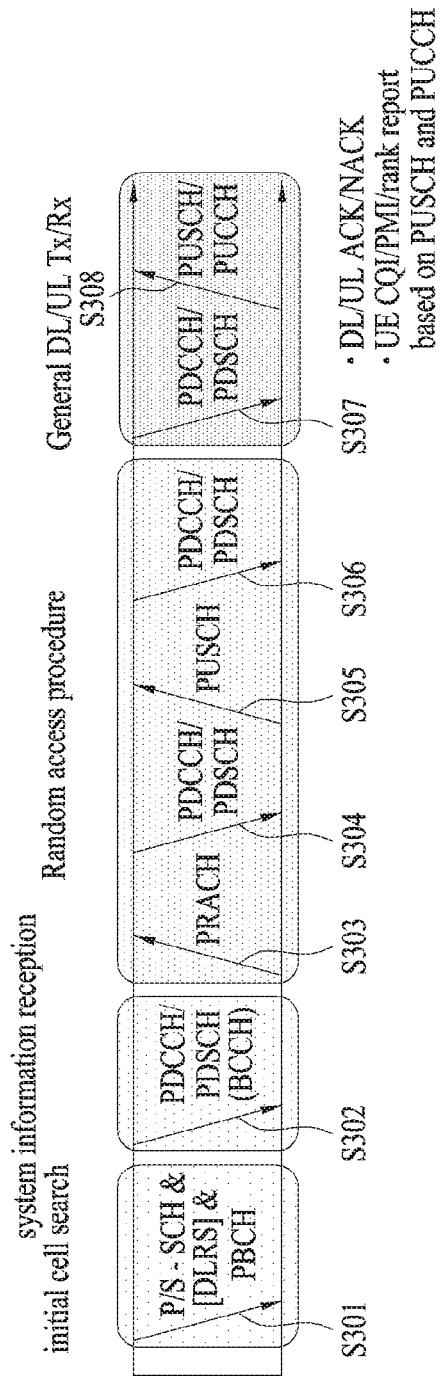
FIG. 3 is a diagram of physical channels used for 3GPP LTE system and a general signal transmission method using the same.

FIG. 3 is a diagram illustrating physical channels used in a 3GPP LTE system and a general method for transmitting a signal using the physical channels.

The user equipment performs initial cell search such as synchronizing with the base station when it newly enters a cell or the power is turned on at step S301. To this end, the user equipment synchronizes with the base station by receiving a primary synchronization channel (P-SCH) and a secondary synchronization channel (S-SCH) from the base station, and acquires information such as cell ID, etc. Afterwards, the user equipment may acquire broadcast information within the cell by receiving a physical broadcast channel (PBCH) from the base station. Meanwhile, the user equipment may identify a downlink channel status by receiving a downlink reference signal (DL RS) at the initial cell search step.

The user equipment which has finished the initial cell search may acquire more detailed system information by receiving a physical downlink shared channel (PDSCH) in accordance with a physical downlink control channel (PDCCH) and information carried in the PDCCH at step S302.

Afterwards, the user equipment may perform a random access procedure (RACH) such as steps S303 to S306 to complete access to the base station. To this end, the user equipment may transmit a preamble through a physical random access channel (PRACH) (S303), and may receive a response message to the preamble through the PDCCH and the PDSCH corresponding to the PDCCH (S304). In case of a contention based RACH, the user equipment may perform a contention resolution procedure such as transmission (S305) of additional physical random access channel and reception (S306) of the physical downlink control channel and the physical downlink shared channel corresponding to the physical downlink control channel.

The user equipment which has performed the aforementioned steps may receive the physical downlink control channel (PDCCH)/physical downlink shared channel (PDSCH) (S307) and transmit a physical uplink shared channel (PUSCH) and a physical uplink control channel (PUCCH) (S308), as a general procedure of transmitting uplink/downlink signals. Control information transmitted from the user equipment to the base station will be referred to as uplink control information (UCI). The UCI includes HARQ ACK/NACK (Hybrid Automatic Repeat and reQuest Acknowledgement/Negative-ACK), SR (Scheduling Request), CSI (Channel State Information), etc. In this specification, the HARQ ACK/NACK will be referred to as HARQ-ACK or ACK/NACK (A/N). The HARQ-ACK includes at least one of positive ACK (simply, referred to as ACK), negative ACK (NACK), DTX and NACK/DTX. The CSI includes CQI (Channel Quality Indicator), PMI (Precoding Matrix Indicator), RI (Rank Indication), etc. Although the UCI is generally transmitted through the PUCCH, it may be transmitted through the PUSCH if control information and traffic data should be transmitted at the same time. Also, the user equipment may non-periodically transmit the UCI through the PUSCH in accordance with request/command of the network.

Figure 4:
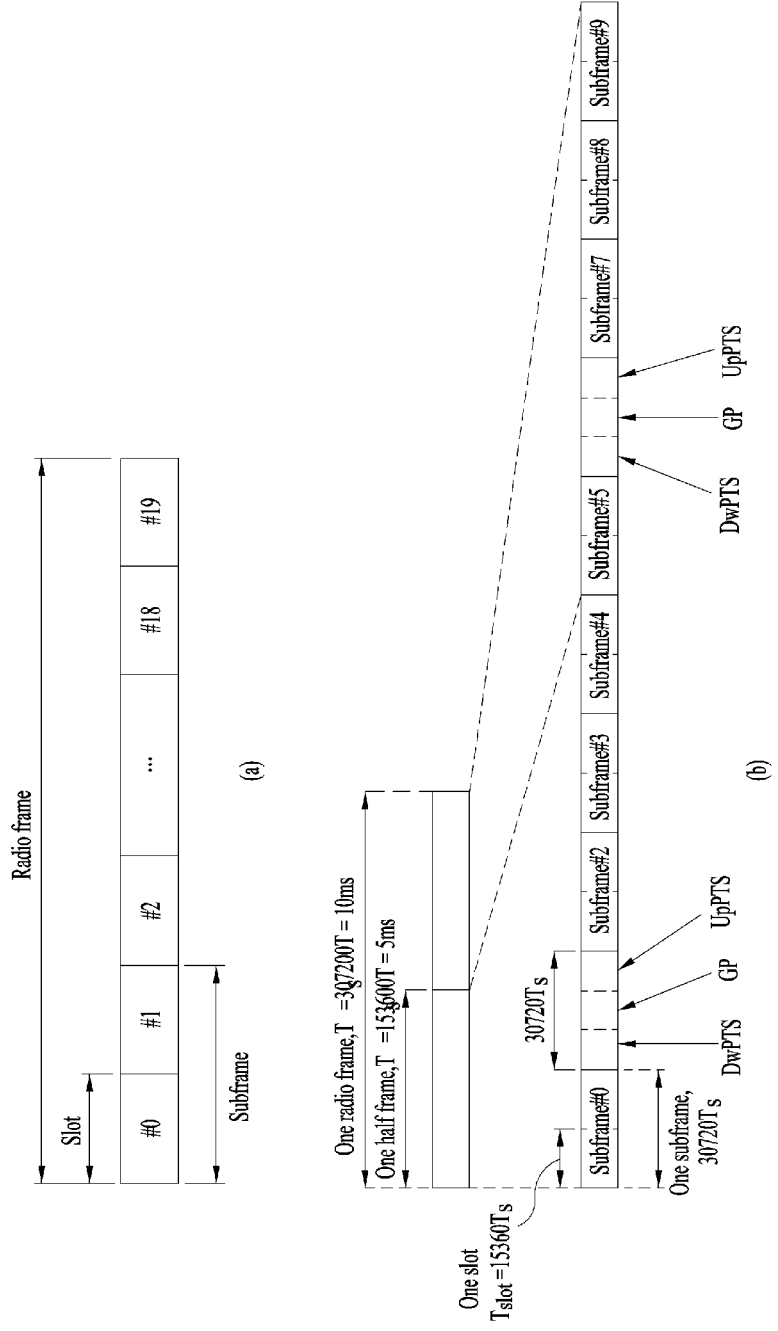
FIG. 4 is a diagram for a structure of a radio frame used in LTE system.

FIG. 4 is a diagram illustrating a structure of a radio frame used in an LTE system.

Referring to FIG. 4, in a cellular OFDM radio packet communication system, uplink/downlink data packet transmission is performed in a unit of subframe, wherein one subframe is defined by a given time interval that includes a plurality of OFDM symbols. The 3GPP LTE standard supports a type 1 radio frame structure applicable to frequency division duplex (FDD) and a type 2 radio frame structure applicable to time division duplex (TDD).

FIG. 4(a) is a diagram illustrating a structure of a type 1 radio frame. The downlink radio frame includes 10 subframes, each of which includes two slots in a time domain. A time required to transmit one subframe will be referred to as a transmission time interval (TTI). For example, one subframe may have a length of 1 ms, and one slot may have a length of 0.5 ms. One slot includes a plurality of OFDM symbols in a time domain and a plurality of resource blocks (RB) in a frequency domain. Since the 3GPP LTE system uses OFDM in a downlink, OFDM symbols represent one symbol interval. The OFDM symbol may be referred to as SC-FDMA symbol or symbol interval. The resource block (RB) as a resource allocation unit may include a plurality of continuous subcarriers in one slot.

The number of OFDM symbols included in one slot may be varied depending on configuration of a cyclic prefix (CP). Examples of the CP include an extended CP and a normal CP. For example, if the OFDM symbols are configured by the normal CP, the number of OFDM symbols included in one slot may be 7. If the OFDM symbols are configured by the extended CP, since the length of one OFDM symbol is increased, the number of OFDM symbols included in one slot is smaller than that of OFDM symbols in case of the normal CP. For example, in case of the extended CP, the number of OFDM symbols included in one slot may be 6. If a channel state is unstable like the case where the user equipment moves at high speed, the extended CP may be used to reduce inter-symbol interference.

If the normal CP is used, since one slot includes seven OFDM symbols, one subframe includes 14 OFDM symbols.

At this time, first maximum three OFDM symbols of each subframe may be allocated to a physical downlink control channel (PDCCH), and the other OFDM symbols may be allocated to a physical downlink shared channel (PDSCH).

FIG. 4(b) is a diagram illustrating a structure of a type 2 radio frame. The type 2 radio frame includes two half frames, each of which includes four general subframes, which include two slots, and a special subframe which includes a downlink pilot time slot (DwPTS), a guard period (GP), and an uplink pilot time slot (UpPTS).

In the special subframe, the DwPTS is used for initial cell search, synchronization or channel estimation at the user equipment. The UpPTS is used for channel estimation at the base station and uplink transmission synchronization of the user equipment. In other words, the DwPTS is used for downlink transmission, whereas the UpPTS is used for uplink transmission. Especially, the UpPTS is used for PRACH preamble or SRS transmission. Also, the guard period is to remove interference occurring in the uplink due to multipath delay of downlink signals between the uplink and the downlink.

Configuration of the special subframe is defined in the current 3GPP standard document as illustrated in Table 1 below. Table 1 illustrates the DwPTS and the UpPTS in case of $T_s=1/(15000\times2048)$, and the other region is configured for the guard period.

frame. Also, Table 2 also illustrates a downlink-uplink switching period in the uplink/downlink subframe configuration of each system.

The structure of the aforementioned radio frame is only exemplary, and various modifications may be made in the number of subframes included in the radio frame, the number of slots included in the subframe, or the number of symbols included in the slot.

Figure 5:
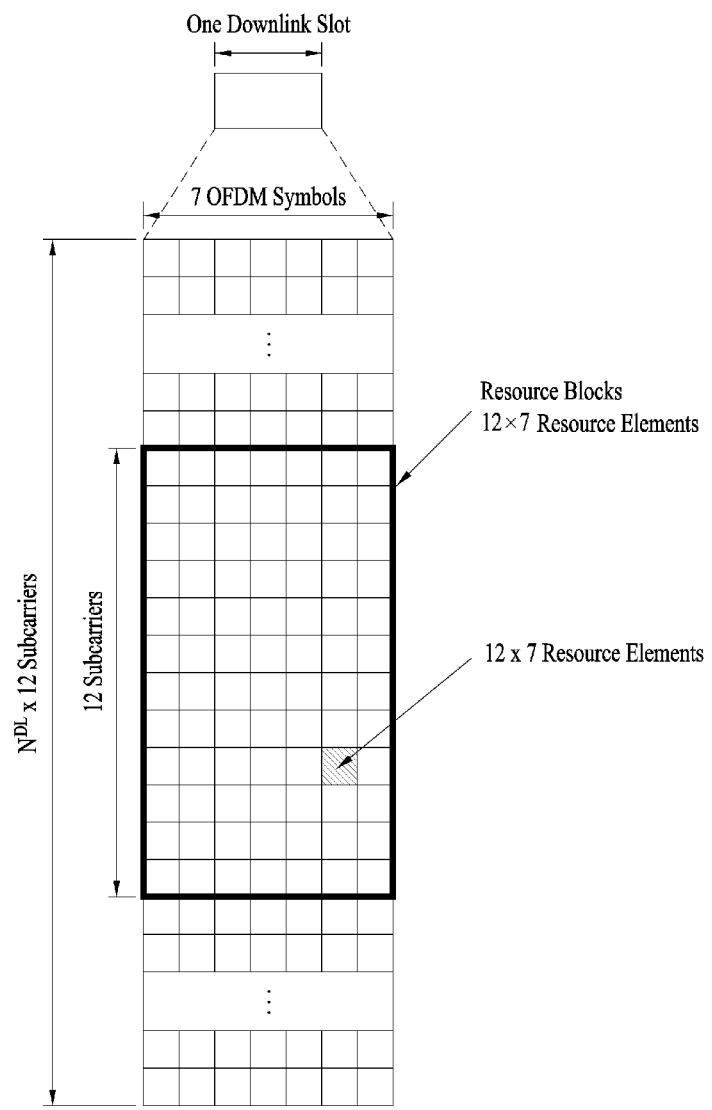
FIG. 5 is a diagram of a resource grid for a downlink slot.

FIG. 5 is a diagram of a resource grid for a downlink slot.

Referring to FIG. 5, a downlink slot includes $N_{symb}^{DL}$ OFDM symbols in time domain and $N_{RB}^{DL}$ resource blocks in frequency domain. Since each of the resource blocks includes $N_{sc}^{RB}$ subcarriers, the downlink slot includes $N_{RB}^{DL} \times N_{sc}^{RB}$ subcarriers in frequency domain. FIG. 5 illustrates that the downlink slot includes 7 OFDM symbols and the resource block includes 12 subcarriers, by which the present invention may be non-limited. For instance, the number of OFDM symbols included in the downlink slot may vary depending on a length of cyclic prefix (CP).

Each element on a resource grid is called a resource element (hereinafter abbreviated RE). One resource element is indicated by one OFDM symbol index and one subcarrier index. One RB includes $N_{symb}^{DL} \times N_{sc}^{RB}$ resource elements. The number ($N_{RB}^{DL}$) of resource blocks included in the downlink slot depends on a downlink transmission bandwidth configured in a cell.

TABLE 1

| | | Normal cyclic prefix in downlink | | | Extended cyclic prefix in downlink | |
|---|---|---|---|---|---|---|
| | | UpPTS | | | UpPTS | |
| Special subframe configuration | DwPTS | Normal cyclic prefix in uplink | Extended cyclic prefix in uplink | DwPTS | Normal cyclic prefix in uplink | Extended cyclic prefix in uplink |
| 0 | 6592 · $T_s$ | 2192 · $T_s$ | 2560 · $T_s$ | 7680 · $T_s$ | 2192 · $T_s$ | 2560 · $T_s$ |
| 1 | 19760 · $T_s$ | | | 20480 · $T_s$ | | |
| 2 | 21952 · $T_s$ | | | 23040 · $T_s$ | | |
| 3 | 24144 · $T_s$ | | | 25600 · $T_s$ | | |
| 4 | 26336 · $T_s$ | | | 7680 · $T_s$ | 4384 · $T_s$ | 5120 · $T_s$ |
| 5 | 6592 · $T_s$ | 4384 · $T_s$ | 5120 · $T_s$ | 20480 · $T_s$ | | |
| 6 | 19760 · $T_s$ | | | 23040 · $T_s$ | | |
| 7 | 21952 · $T_s$ | | | 12800 · $T_s$ | | |
| 8 | 24144 · $T_s$ | | | — | — | — |
| 9 | 13168 · $T_s$ | | | — | — | — |

In the meantime, the structure of the type 2 radio frame, that is, uplink/downlink configuration (UL/DL configuration) in the TDD system is as illustrated in Table 2 below.

TABLE 2

| Uplink-downlink configuration | Downlink-to-Uplink Switch-point periodicity | Subframe number | | | | | | | | | |
|---|---|---|---|---|---|---|---|---|---|---|---|
| | | 0 | 1 | 2 | 3 | 4 | 5 | 6 | 7 | 8 | 9 |
| 0 | 5 ms | D | S | U | U | U | D | S | U | U | U |
| 1 | 5 ms | D | S | U | U | D | D | S | U | U | D |
| 2 | 5 ms | D | S | U | D | D | D | S | U | D | D |
| 3 | 10 ms | D | S | U | U | U | D | D | D | D | D |
| 4 | 10 ms | D | S | U | U | D | D | D | D | D | D |
| 5 | 10 ms | D | S | U | D | D | D | D | D | D | D |
| 6 | 5 ms | D | S | U | U | U | D | S | U | U | D |

Figure 6:
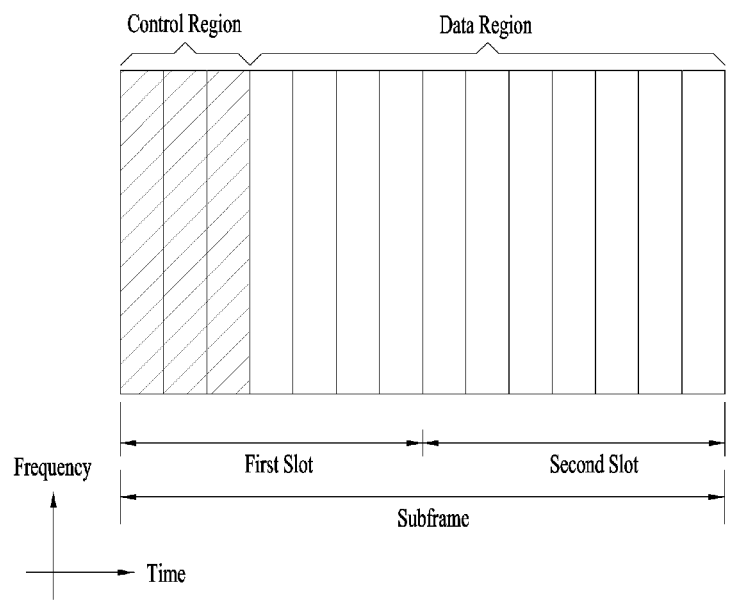
FIG. 6 is a diagram for an example of a structure of a downlink subframe.

In the above Table 2, D means the downlink subframe, U means the uplink subframe, and S means the special sub- FIG. 6 is a diagram for an example of a structure of a downlink subframe.

Referring to FIG. 6, maximum 3 (4) OFDM symbols located in a head part of a first slot of a subframe correspond to a control region to which control channels are assigned. The rest of OFDM symbols correspond to a data region to which PDSCHs (physical downlink shared channels) are assigned. Examples of downlink control channels used in LTE include a physical control format indicator channel (PCFICH), a physical downlink control channel (PDCCH), and a physical hybrid ARQ indicator channel (PHICH). The PCFICH is transmitted in a first OFDM symbol of a subframe and carries an information on the number of OFDM symbols used for transmission of the control channel within the subframe. The PHICH is a response channel in response to uplink transmission and carries an HARQ ACK/NACK (hybrid automatic repeat request acknowledgement/negative-acknowledgement) signal.

Control information transmitted through the PDCCH is referred to as downlink control information (DCI). The DCI includes resource allocation information for a user equipment or user equipment group and different control information. For example, the DCI includes uplink/downlink scheduling information, uplink transmission (Tx) power control command and the like.

The PDCCH may include transmission format and resource allocation information of a downlink shared channel (DL-SCH), transmission format and resource allocation information of an uplink shared channel (UL-SCH), paging information on a paging channel (PCH), system information on the DL-SCH, resource allocation information of an upper layer control message such as a random access response transmitted on PDSCH, transmission (Tx) power control command set for individual user equipments within a random user equipment group, transmission (Tx) power control command, activation indication information of voice over Internet protocol (VoIP) and the like. A plurality of PDCCHs may be transmitted within the control region. A user equipment may monitor a plurality of the PDCCHs. The PDCCH is transmitted on aggregation of one or a plurality of continuous control channel elements (CCEs). The CCE is a logic assignment unit used to provide the PDCCH with a coding rate based on a radio channel state. The CCE corresponds to a plurality of resource element groups (REGs). A format of the PDCCH and the number of available bits of the PDCCH are determined depending on the number of CCEs. A base station determines the PDCCH format in accordance with the DCI which will be transmitted to a user equipment and attaches a cyclic redundancy check (CRC) to a control information. The CRC is masked with an identifier (e.g., radio network temporary identifier (RNTI)) in accordance with an owner or usage of the PDCCH. For instance, if the PDCCH is for a specific user equipment, the CRC may be masked with an identifier (e.g., cell-RNTI (C-RNTI)) of the corresponding user equipment. If the PDCCH is for a paging message, the CRC may be masked with a paging identifier (e.g., paging-RNTI (P-RNTI)). If the PDCCH is for a system information (particularly, system information block (SIB)), the CRC may be masked with a system information RNTI (SI-RNTI). If the PDCCH is for a random access response, the CRC may be masked with a random access RNTI (RA-RNTI).

Figure 7:
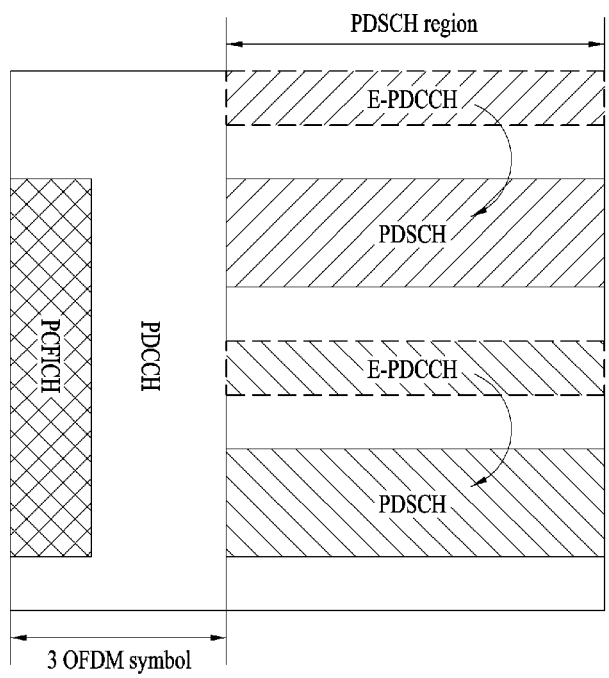
FIG. 7 is a diagram for examples of EPDCCH (Enhanced Physical Downlink Control Channel) and PDSCH (Physical Downlink Shared Channel) scheduled by the EPDCCH.

FIG. 7 is a diagram for an example of EPDCCH and PDSCH scheduled by the EPDCCH.

Referring to FIG. 7, EPDCCH may be used in a manner of being defined in a part of a PDSCH region in which data is generally transmitted. A user equipment should perform a blind decoding process for detecting whether EPDCCH of the corresponding user equipment is present. If the number of user equipments that perform the same scheduling operation (i.e., control of PDSCH and PUSCH) as conventional legacy PDCCH but access a node such as RRH increases, more EPDCCHs are allocated to the PDSCH region. Thus, the EPDCCH has a disadvantage in that complexity may increase due to an increase in the number of times of blind decoding, which should be performed by the user equipment.

Hereinafter, a resource-specific measurement scheme is described.

As a method of reducing inter-cell interference, an inter-cell interference mitigation scheme has been proposed. According to the scheme, an interfering cell uses an almost blank subframe (hereinafter referred to as ABS) in which some physical channels are transmitted with reduced transmit power or no channel is transmitted. And, an interfered cell schedules UE in consideration of the ABS. In this case, a subframe designated as the ABS is generally configured to transmit CRS only.

In this case, in aspect of UE of the interfered cell, an interference level significantly varies depending on a subframe. In order to perform a more accurate radio link monitoring (RLM) operation, perform a radio resource management (RRM) operation for measuring reference signal received power/reference signal received quality (RSRP/RSRQ), or measure CSI in each subframe, it should be restricted that RLM/RRM operation is performed on a set of subframes having uniform interference characteristics. According to the current LTE standard document, two CSI subframe sets are defined for resource-specific measurement.

Hereinafter, examples of transmission modes are described.

In the current LTE standard document, particularly, in 3GPP TS 36.213 document, downlink transmission modes are defined as shown in Table 3 and Table 4 in the following description. Moreover, the following transmission modes are configured for a user equipment through high layer signaling, i.e., RRC signaling.

TABLE 3

| Transmission mode | DCI format | Search Space | Transmission scheme of PDSCH corresponding to PDCCH |
|---|---|---|---|
| Mode 1 | DCI format 1A | Common and UE specific by C-RNTI | Single-antenna port, port 0 |
|  | DCI format 1 | UE specific by C-RNTI | Single-antenna port, port 0 |
| Mode 2 | DCI format 1A | Common and UE specific by C-RNTI | Transmit diversity |
|  | DCI format 1 | UE specific by C-RNTI | Transmit diversity |
| Mode 3 | DCI format 1A | Common and UE specific by C-RNTI | Transmit diversity |
|  | DCI format 2A | UE specific by C-RNTI | Large delay CDD (see clause 7.1.3) or Transmit diversity |
| Mode 4 | DCI format 1A | Common and UE specific by C-RNTI | Transmit diversity |
|  | DCI format 2 | UE specific by C-RNTI | Closed-loop spatial multiplexing(see clause 7.1.4) or Transmit diversity |
| Mode 5 | DCI format 1A | Common and UE specific by C-RNTI | Transmit diversity |
|  | DCI format 1D | UE specific by C-RNTI | Multi-user MIMO(see clause 7.1.5) |
| Mode 6 | DCI format 1A | Common and UE specific by C-RNTI | Transmit diversity |
|  | DCI format 1B | UE specific by C-RNTI | Closed-loop spatial multiplexing (see clause 7.1.4) using a single transmission layer |
| Mode 7 | DCI format 1A | Common and UE specific by C-RNTI | If the number of PBCH antenna ports is one, Single-antenna port, port 0 is used, otherwise Transmit diversity |
|  | DCI format 1 | UE specific by C-RNTI | Single-antenna port, port 5 |
| Mode 8 | DCI format 1A | Common and UE specific by C-RNTI | If the number of PBCH antenna ports is one, Single-antenna port, port 0 is used, otherwise Transmit diversity |
|  | DCI format 2B | UE specific by C-RNTI | Dual layer transmission, port 7 and 8 (see clause 7.1.5A) or single-antenna port, port 7 or 8 |

TABLE 3-continued

| Transmission mode | DCI format | Search Space | Transmission scheme of PDSCH corresponding to PDCCH |
|---|---|---|---|
| Mode 9 | DCI format 1A | Common and UE specific by C-RNTI | Non-MBSFN subframe: If the number of PBCH antenna ports is one, Single-antenna port, port 0 is used, otherwise Transmit diversity MBSFN subframe: Single-antenna port, port 7 |
| | DCI format 2C | UE specific by C-RNTI | Up to 8 layer transmission, ports 7-14 (see clause 7.1.5B) or single-antenna port, port 7 or 8 |
| Mode 10 | DCI format 1A | Common and UE specific by C-RNTI | Non-MBSFN subframe: If the number of PBCH antenna ports is one, Single-antenna port, port 0 is used, otherwise Transmit diversity MBSFN subframe: Single-antenna port, port 7 |
| | DCI format 2D | UE specific by C-RNTI | Up to 8 layer transmission, ports 7-14 (see clause 7.1.5B) or single-antenna port, port 7 or 8 |

TABLE 4

| Transmission mode | DCI format | Search Space | Transmission scheme of PDSCH corresponding to EPDCCH |
|---|---|---|---|
| Mode 1 | DCI format 1A | UE specific by C-RNTI | Single-antenna port, port 0 |
| | DCI format 1 | UE specific by C-RNTI | Single-antenna port, port 0 |
| Mode 2 | DCI format 1A | UE specific by C-RNTI | Transmit diversity |
| | DCI format 1 | UE specific by C-RNTI | Transmit diversity |
| Mode 3 | DCI format 1A | UE specific by C-RNTI | Transmit diversity |
| | DCI format 2A | UE specific by C-RNTI | Large delay CDD (see clause 7.1.3) or Transmit diversity |
| Mode 4 | DCI format 1A | UE specific by C-RNTI | Transmit diversity |
| | DCI format 2 | UE specific by C-RNTI | Closed-loop spatial multiplexing(see clause 7.1.4) or Transmit diversity |
| Mode 5 | DCI format 1A | UE specific by C-RNTI | Transmit diversity |
| | DCI format 1D | UE specific by C-RNTI | Multi-user MIMO(see clause 7.1.5) |
| Mode 6 | DCI format 1A | UE specific by C-RNTI | Transmit diversity |
| | DCI format 1B | UE specific by C-RNTI | Closed-loop spatial multiplexing (see clause 7.1.4) using a single transmission layer |
| Mode 7 | DCI format 1A | UE specific by C-RNTI | If the number of PBCH antenna ports is one, Single-antenna port, port 0 is used, otherwise Transmit diversity |
| | DCI format 1 | UE specific by C-RNTI | Single-antenna port, port 5 |
| Mode 8 | DCI format 1A | UE specific by C-RNTI | If the number of PBCH antenna ports is one, Single-antenna port, port 0 is used, otherwise Transmit diversity |
| | DCI format 2B | UE specific by C-RNTI | Dual layer transmission, port 7 and 8 (see clause 7.1.5A) or single-antenna port, port 7 or 8 |
| Mode 9 | DCI format 1A | UE specific by C-RNTI | Non-MBSFN subframe: If the number of PBCH antenna ports is one, Single-antenna port, port 0 is used, otherwise Transmit diversity MBSFN subframe: Single-antenna port, port 7 |
| | DCI format 2C | UE specific by C-RNTI | Up to 8 layer transmission, ports 7-14 (see clause 7.1.5B) or single-antenna port, port 7 or 8 |
| Mode 10 | DCI format 1A | UE specific by C-RNTI | Non-MBSFN subframe: If the number of PBCH antenna ports is one, Single-antenna port, port 0 is used, otherwise Transmit diversity MBSFN subframe: Single-antenna port, port 7 |
| | DCI format 2D | UE specific by C-RNTI | Up to 8 layer transmission, ports 7-14 (see clause 7.1.5B) or single-antenna port, port 7 or 8 |

In the current 3GPP LTE standard document, DCI formats according to a type of RNTI used for masking PDCCH/EPDCCH are defined. Particularly, in the case of C-RNTI and SPS C-RNTI, a transmission mode and a DCI format corresponding to the transmission mode, i.e., a DCI format based on transmission mode are defined. Moreover, DCI format 1A, which can be applied to each of the transmission modes, is also defined. Table 3 shows an example of the case that the type of RNTI masking PDCCH corresponds to the C-RNTI and Table 4 shows an example of the case that the type of RNTI masking EPDCCH corresponds to the C-RNTI. In addition, details of the case that the type of RNTI masking PDCCH/EPDCCH corresponds to the SPS C-RNTI can be referred to LTE/LTE-A standard document 36.213.

For instance, if DCI format 1B is detected as a result of performing blind decoding on the PDCCH masked with the C-RNTI in Table 3 in a UE-specific search space, PDSCH is decoded in a manner of assuming that PDSCH is transmitted by a closed-loop spatial multiplexing scheme using a single layer.

In the following description, channel state information is explained.

MIMO schemes may be classified into an open-loop MIMO scheme and a closed-loop MIMO scheme. In the open-loop MIMO scheme, a MIMO transmitting end performs MIMO transmission without receiving CSI feedback from a MIMO receiving end. In the closed-loop MIMO scheme, the MIMO transmitting end receives CSI feedback from the MIMO receiving end and then performs MIMO transmission. In the closed-loop MIMO scheme, each of the transmitting end and the receiving end may perform beamforming based on CSI to achieve a multiplexing gain of MIMO transmitting antennas. To allow the receiving end (e.g., a user equipment or a relay as a backhaul downlink reception entity) to feed CSI back, the transmitting end (e.g., a base station or a relay as an access downlink transmission entity) may allocate an uplink control channel or an uplink shared channel to the receiving end.

The CSI feedback may include a rank indicator (RI), a precoding matrix index (PMI), and a channel quality indicator (CQI).

The RI is information on a channel rank. The channel rank indicates the maximum number of layers (or streams) capable of carrying different information through the same time-frequency resources. Since the rank is determined mainly according to long-term fading of a channel, the RI may be fed back in a longer period (i.e., less frequently) than the PMI and the CQI.

The PMI is information on a precoding matrix used for transmission of a transmitting end and has a value reflecting the spatial characteristics of a channel. Precoding refers to mapping transmission layers to transmitting antennas. A layer-antenna mapping relationship may be determined according to a precoding matrix. The PMI is a precoding matrix index of a base station, which is preferred by a receiving end (e.g., a user equipment or a relay) based on a metric such as SINR (signal-to-interference plus noise ratio), etc. In order to reduce feedback overhead of precoding information, the transmitting end and the receiving end may pre-share a codebook including multiple precoding matrices. And, only an index indicating a specific precoding matrix in the corresponding codebook may be fed back.

The CQI is information indicating channel quality or channel strength. The CQI may be expressed as a predetermined modulation and coding scheme (MCS) combination. In particular, a CQI index that is fed back indicates the corresponding modulation scheme and code rate. In general, the CQI corresponds to a value reflecting reception SINR that can be obtained when a base station configures a spatial channel using PMI.

In a system supporting an extended antenna configuration (e.g. an LTE-A system), additional acquisition of multi-user (MU) diversity using an MU-MIMO scheme is considered. According to the MU-MIMO scheme, when a base station performs downlink transmission using CSI fed back by one user equipment among multiple user equipments, it is necessary to prevent occurrence of interference to other user equipments since there is an interference channel between user equipments multiplexed in an antenna domain. Accordingly, CSI of higher accuracy than CSI in a single-user (SU)-MIMO scheme should be fed back in order to correctly perform a MU-MIMO operation.

A new CSI feedback scheme may be adopted by modifying conventional CSI including RI, PMI, and CQI so as to measure and report CSI more accurately. For example, precoding information fed back by the receiving end may be indicated by a combination of two PMIs. One (a $1^{st}$ PMI) of the two PMIs has a long-term and/or wideband property, and may be referred to as W1. The other PMI (a $2^{nd}$ PMI) has a short-term and/or subband property, and may be referred to as W2. A final PMI may be determined by a combination (or a function) of W1 and W2. For example, if the final PMI is denoted by W, it may be defined that W=W1*W2 or W=W2*W1.

Hereinafter, a CQI calculation is described.

On the assumption that a downlink receiving end is a user equipment, a CQI calculation will be described below. A description will be given of a method of configuring/defining a resource (hereinafter referred to as a reference resource) corresponding to reference for the CQI calculation in CSI reporting of a user equipment. First, a definition of the CQI is described in detail.

CQI reported by a user equipment corresponds to a specific index value. A CQI index is a value for indicating a modulation scheme, a code rate and the like, which correspond to a channel state. For example, CQI indices and definitions thereof are expressed as Table 5.

TABLE 5

| CQI index | modulation | code rate × 1024 | efficiency |
|---|---|---|---|
| 0 | | out of range | |
| 1 | QPSK | 78 | 0.1523 |
| 2 | QPSK | 120 | 0.2344 |
| 3 | QPSK | 193 | 0.3770 |
| 4 | QPSK | 308 | 0.6016 |
| 5 | QPSK | 449 | 0.8770 |
| 6 | QPSK | 602 | 1.1758 |
| 7 | 16QAM | 378 | 1.4766 |
| 8 | 16QAM | 490 | 1.9141 |
| 9 | 16QAM | 616 | 2.4063 |
| 10 | 64QAM | 466 | 2.7305 |
| 11 | 64QAM | 567 | 3.3223 |
| 12 | 64QAM | 666 | 3.9023 |
| 13 | 64QAM | 772 | 4.5234 |
| 14 | 64QAM | 873 | 5.1152 |
| 15 | 64QAM | 948 | 5.5547 |

For each CQI value reported in uplink subframe n, a user equipment can determine a highest CQI index that satisfies a predetermined condition among CQI indices 1 to 15 in Table 5, based on an unrestricted observation in time and frequency. The predetermined condition may be determined such that a single PDSCH transport block occupying a group of downlink physical resource blocks called CQI reference resources can be received at a transport block error probability of less than 0.1 (i.e. 10%) with a combination of a modulation scheme (e.g., MCS) and a transport block size (TBS) corresponding to the determined CQI. If CQI index 1 does not satisfy the condition, the user equipment can determine CQI index 0.

If CSI subframe sets $C_{CSI,0}$ and $C_{CSI,1}$ are configured by a higher layer, each CSI-reference resource belongs to either $C_{CSI,0}$ or $C_{CSI,1}$ but not to both. When the CSI subframe sets $C_{CSI,0}$ and $C_{CSI,1}$ are configured by the higher layer, a user equipment does not receive a trigger for a CSI-reference resource in a subframe that does not belong to either of the two subframe sets. For a user equipment that performs periodic CSI reporting in transmission mode 10, a CSI subframe set for CSI-reference resources is configured through a high layer in each CSI process.

In the case of transmission mode 9, if pmi-RI-Report is configured by a higher layer, a user equipment may perform channel measurement for calculating the CQI value reported in the uplink subframe n based on only CSI-RS. In this case, the user equipment is configured to assume that the CSI-RS is non-zero power. In the case of transmission mode 9 in which the pmi-RI-Report is not configured by the higher layer or in the case of transmission modes 1-8, a user equipment may perform the channel measurement for the CQI calculation based on CRS.

In the case of transmission mode 10, a user equipment may perform channel measurement for calculating a CQI value corresponding to the uplink subframe n and the CSI process based on only non-zero power of CSI-RS in CSI-RS resources configured to be associated with the CSI process.

Alternatively, in the case of transmission mode 10, a user equipment may also perform the channel measurement for calculating the CQI value corresponding to the uplink subframe n and the CSI process based on only zero power of CSI-RS in CSI-IM resources configured to be associated with the CSI process. In the case of transmission mode 10, if the CSI subframe sets $C_{CSI,0}$ and $C_{CSI,1}$ are configured by the high layer, a CSI-IM resource in a subframe set belonging to a corresponding CSI-reference resource is used for calculating interference measurement.

A combination of a modulation scheme and a transport block size may correspond to a CQI index, if all the following conditions are satisfied: i) the combination may be signaled for transmission on PDSCH in a CQI reference resource according to a relevant transport block size table; ii) the modulation scheme is indicated by the corresponding CQI index; and iii) when the combination of the modulation scheme and the transport block size is applied to the reference resource, it results in a valid channel code rate which is the closest possible to the code rate indicated by the CQI index. If two or more combinations of the modulation scheme and the transport block size result in a code rate equally close to the code rate indicated by the CQI index, only the combination with a smallest transport block size can be selected.

The CQI reference resource is defined as follows.

In frequency domain, the CQI reference resource is defined by a group of downlink physical resource blocks corresponding to a band to which the derived CQI value relates.

In the case of transmission modes 1-9 or in the case of transmission mode 10 having a single CSI process of a serving cell configured therein, the CQI reference resource is defined by a single DL subframe $n-n_{CQI\_ref}$ in time domain. In the case of periodic CQI reporting, $n_{CQI\_ref}$ is determined as a smallest value among values equal to or greater than 4, such that the DL subframe $n-n_{CQI\_ref}$ corresponds to a valid DL subframe. In the case of aperiodic CQI reporting, $n_{CQI\_ref}$ is determined such that the CQI reference resource is in the same valid DL subframe corresponding to a CQI request (or the same valid DL subframe in which the CQI request is received) in a UL DCI format (i.e., a PDCCH DCI format for providing UL scheduling control information to a user equipment). Moreover, in the case of the aperiodic CQI reporting, $n_{CQI\_ref}$ is equal to 4 and DL subframe $n-n_{CQI\_ref}$ corresponds to a valid DL subframe. In this case, the DL subframe $n-n_{CQI\_ref}$ may be received after a subframe corresponding to a CQI request (or a subframe in which the CQI request is received) in a random access response grant.

In the case of transmission mode 10 in which a multitude of CSI processes for a serving cell are configured, the CQI reference resource is defined as a single DL subframe $n-n_{CQI\_ref}$ in time domain.

In the case of periodic/aperiodic CQI reporting in FDD, $n_{CQI\_ref}$ is defined as a smallest value among values equal to or greater than 5, which also corresponds to a valid DL subframe and aperiodic CSI reporting corresponding to a CSI request in a UL DCI format. In the case of aperiodic CQI reporting in FDD, $n_{CQI\_ref}$ is equal to 5 and DL subframe $n-n_{CQI\_ref}$ corresponds to the valid DL subframe. In this case, the DL subframe $n-n_{CQI\_ref}$ may be received after the subframe corresponding to the CQI request (or the subframe in which the CQI request is received) in the random access response grant.

In the case of periodic/aperiodic CSI reporting with 2 or 3 CSI processes in TDD, in the case of periodic/aperiodic CQI reporting, $n_{CQI\_ref}$ is defined as a smallest value among values equal to or greater than 4, which also corresponds to a valid DL subframe and aperiodic CSI reporting corresponding to a CSI request in a UL DCI format. In the case of aperiodic CSI reporting with 2 or 3 CSI processes in TDD, $n_{CQI\_ref}$ is equal to 4 and DL subframe $n-n_{CQI\_ref}$ corresponds to the valid DL subframe. In this case, the DL subframe $n_{CQI\_ref}$ may be received after the subframe corresponding to the CQI request (or the subframe in which the CQI request is received) in the random access response grant.

In the case of periodic/aperiodic CSI reporting with 4 CSI processes in TDD, in the case of periodic/aperiodic CQI reporting, $n_{CQI\_ref}$ is defined as a smallest value among values equal to or greater than 5, which also corresponds to a valid DL subframe and aperiodic CSI reporting corresponding to a CSI request in a UL DCI format. In the case of aperiodic CSI reporting with 4 CSI processes in TDD, $n_{CQI\_ref}$ is equal to 5 and DL subframe $n-n_{CQI\_ref}$ corresponds to the valid DL subframe. In this case, the DL subframe $n-n_{CQI\_ref}$ may be received after the subframe corresponding to the CQI request (or the subframe in which the CQI request is received) in the random access response grant.

In this case, the valid downlink subframe means a downlink subframe that is set for a corresponding user equipment, does not correspond to an MBSFN subframe in transmission modes other than transmission mode 9/10, does not include a DwPTS field when a DwPTS length is less than (7680*Ts) (Ts=1/(15000×2048) seconds), and does not belong to a measurement gap set for the corresponding user equipment. Moreover, in the case of periodic CSI reporting, the valid downlink subframe means an element of a CSI subframe set connected to the periodic CSI reporting. In the case that aperiodic CSI reporting of a CSI process is set in transmission mode 10 in which a multitude of CSI processes are configured, the valid downlink subframe means an element of the CSI subframe set connected to the periodic CSI reporting. In the case of a user equipment having a CSI subframe set for a CSI process configured therein, the valid subframe set means an element of a CSI subframe set connected to a downlink subframe corresponding to a CSI request in a UL DCI format.

If the valid downlink subframe for the CQI reference resource is not present, CQI reporting can be omitted in the uplink subframe n.

In the layer domain, the CQI reference resource is defined by random RI and PMI on which the CQI is conditioned.

In the CQI reference resource, a user equipment may assume the followings in order to derive the CQI index: (1) the first 3 OFDM symbols of a DL subframe are used for usage of control signaling, (2) there is no resource element used for a primary synchronization signal, a secondary synchronization signal or a physical broadcast channel, (3) it has a CP length of a non-MBSFN subframe, (4) a redundancy version is set to 0, (5) when CSI-RS is used for channel measurement, a ratio of PDSCH EPRE (energy per resource element) to CSI-RS EPRE has a prescribed value signaled by a higher layer, (6) a PDSCH transmission scheme (e.g., single antenna port transmission, transmission diversity, spatial multiplexing, MU-MIMO, etc.) defined in each transmission mode is currently configured for the corresponding UE (which may be the default mode), (7) when the CSI-RS is used for the channel measurement, the ratio of PDSCH EPRE to CSI-RS EPRE may be determined according to a prescribed condition, and (8) a PDSCH transmission is determined according to transmission mode currently configured for the corresponding user equipment as shown in Table 6.

TABLE 6

| Transmission Mode | Transmission Scheme of PDSCH |
| --- | --- |
| 1 | Single-antenna port, port 0 |
| 2 | Transmit diversity |
| 3 | Transmit diversity if the associated rank indicator is 1, otherwise large delay CDD |
| 4 | Closed-loop spatial multiplexing |
| 5 | Multi-user MIMO |
| 6 | Closed-loop spatial multiplexing with a single transmission layer |
| 7 | If the number of PBCH antenna ports is one, Single-antenna port, port 0; otherwise Transmit diversity |
| 8 | If the UE is configured without PMI/RI reporting: if the number of PBCH antenna ports is one, single-antenna port, port 0; otherwise transmit diversity<br>If the UE is configured with PMI/RI reporting: closed-loop spatial multiplexing |
| 9 | If the UE is configured without PMI/RI reporting: if the number of PBCH antenna ports is one, single-antenna port, port 0; otherwise transmit diversity<br>If the UE is configured with PMI/RI reporting: if the number of CSI-RS ports is one, single-antenna port, port 7; otherwise up to 8 layer transmission, ports 7-14 (see subclause 7.1.5B [1]) |
| 10 | If a CSI process of the UE is configured without PMI/RI reporting: if the number of CSI-RS ports is one, single-antenna port, port7; otherwise transmit diversity<br>If a CSI process of the UE is configured with PMI/RI reporting: if the number of CSI-RS ports is one, single-antenna port, port 7; otherwise up to 8 layer transmission, ports 7-14 (see subclause 7.1.5B [1]) |

Furthermore, more details of CQI definition such as CSI reporting in case that PMI/RI reporting is not configured can be referred to 3GPP TS36.213.

Based on the above-mentioned description, the present invention proposes a method of securing a channel estimation operation and a reporting operation of a user equipment stably irrespective of success or failure of reception of usage change messages in case that a plurality of cells dynamically change usages of radio resources depending on their system load statuses and then inform the user equipment of related information through predefined formats of radio resource usage change messages (reconfiguration messages).

In this case, a usage change message may be defined as a type of a high layer signal (e.g., SIB/PBCH/MAC/RRC) or a type of a physical layer signal (e.g., PDCCH/EPDCCH/PDSCH). Moreover, the usage change message may have a UE-specific characteristic, a cell-specific characteristic, a UE-group-specific characteristic or a UE-group-common characteristic. In addition, the usage change message may be transmitted through a UE-specific search space (USS) or a common search space (CSS).

For the convenience of the explanation, embodiments are explained based on 3GPP LTE system in the following description. However, the scope of the system to which the present invention is applicable can be extended to other systems as well as the 3GPP LTE system.

The embodiments of the present invention can be extensively applied to a case of dynamically changing a resource on a specific cell or a component carrier (CC) depending on a system load status in an environment to which carrier aggregation (CA) is applied. Moreover, the embodiments of the present invention can be extensively applied to a case of dynamically changing usage of a radio resource in a TDD system, a FDD system or a TDD-FDD combined system. In the following description, assume a situation that each cell dynamically changes usage of an existing radio resource depending on its system load status in a TDD system environment for the convenience of the explanation of the embodiments.

(Legacy) Radio resources can be mainly divided into two types due to a dynamic change of radio resource usage.

For instance, the legacy radio resources can be divided into a resource set (i.e., static resources) used for static (or fixed) usage and a resource set (i.e., flexible resources) of which usage is dynamically changed. For example, a resource set used for the same usage as that of UL-DL configuration on SIB (or continuously used for the same usage) may be defined as a static resource set. And, a resource set used for usage different from that of the UL-DL configuration on the SIB (or having a possibility of being used for different usage) may be defined as a flexible resource set.

As another example, a resource set used for the same usage as that of UL-DL configuration configured at a previous usage change time (e.g., a usage change scheme based on a predefined usage change period) (or continuously used for the same usage) may be defined as the static resource set. And, a resource set used for usage different from that of the UL-DL configuration configured at the previous usage change time (or having a possibility of being used for different usage) may be defined as the flexible resource set.

As further example, a resource set used for the same usage as that of UL-DL configuration of a predefined reference DL HARQ timeline (or UL-DL configuration of a reference UL HARQ timeline) (or continuously used for the same usage) may be defined as the static resource set. And, a resource set used for usage different from that of the UL-DL configuration of the reference DL HARQ timeline (or the UL-DL configuration of the reference UL HARQ timeline) (or having a possibility of being used for different usage) may be defined as the flexible resource set.

In this case, the reference DL/UL HARQ timeline is a HARQ timeline configured for the purpose of maintaining a stable HARQ timeline irrespective of (re)change in a UL-DL configuration. It may be defined as a DL/UL HARQ timeline of a UL-DL configuration, which includes one of i) union of downlink subframes/union of uplink subframes of reconfigurable UL-DL configuration candidates, ii) intersection of downlink subframes/intersection of uplink subframes of reconfigurable UL-DL configuration candidates, iii) intersection of downlink subframes/intersection of uplink subframes of reconfigurable UL-DL configuration candidates, and iv) intersection of downlink subframes/union of uplink subframes of reconfigurable UL-DL configuration candidates.

Figure 8:
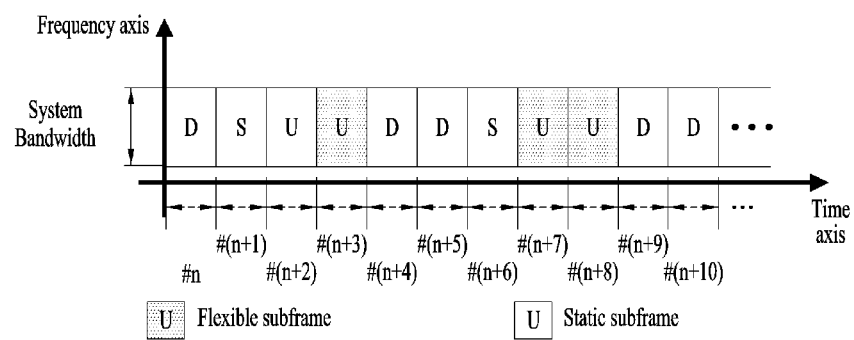
FIG. 8 is a diagram for an example of dividing legacy subframes into a static subframe set and a flexible subframe set in a TDD (Time Division Duplex) system environment.

FIG. 8 is a diagram for an example of dividing legacy subframes into a static subframe set and a flexible subframe set in a TDD system environment. In FIG. 8, a legacy UL-DL configuration configured through a system information block (SIB) signal is assumed to be UL-DL configuration #1 (i.e., DSUUDDSUUD). And, it is also assumed that a base station informs a user equipment of information on a reconfiguration of usage of a radio resource through a predefined signal.

A radio resource usage change message (reconfiguration message) is used for the purpose of informing usages of radio resources, i) which appear later by including a reception time of the corresponding usage change message, ii) which appear later by excluding the reception time of the corresponding usage change message, or iii) which appear after an elapse of a predefined time (i.e., after subframe offset) from the reception time of the corresponding usage change message.

Thus, for stable UL/DL communication in a system and stable CSI calculation and reporting in a user equipment, a usage change message transmitting/receiving method with high success probability needs to be defined. Moreover, in case that a specific user equipment does not receive a usage change message successfully, a UL-DL configuration (i.e., fallback operation with respect to a UL-DL configuration) assumed by the corresponding user equipment needs to be defined. In this case, the case that the user equipment does not receive the usage change message successfully may include, for example, a case that when the user equipment performs CRC (cyclic redundancy check) on the received usage change message, it is determined as False, a case that the user equipment misses the usage change message (e.g., a case that the user equipment misses the usage change message due to a DRX operation), and the like.

Figure 9A:
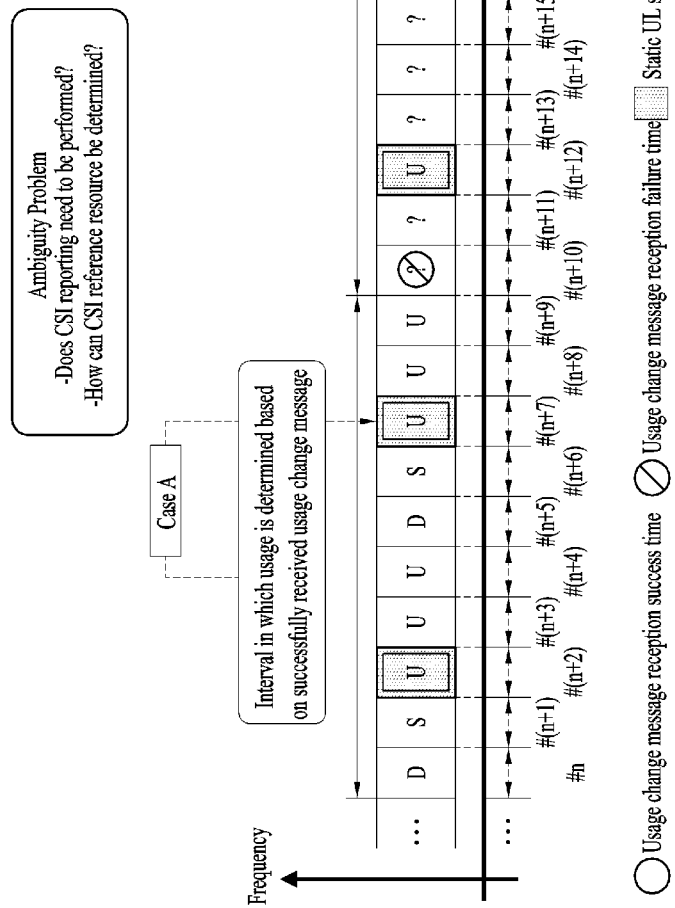
FIG. 9 is a reference diagram to explain ambiguity in CSI reporting and a location of a CSI-reference resource caused by usage change message reception failure of a user equipment.
Figure 9C:
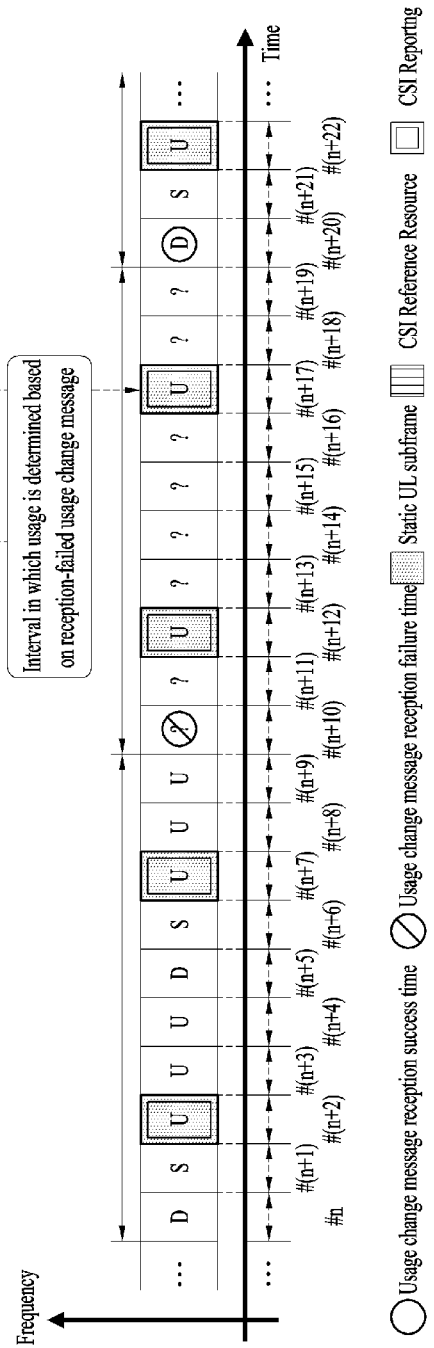
Figure 9D:
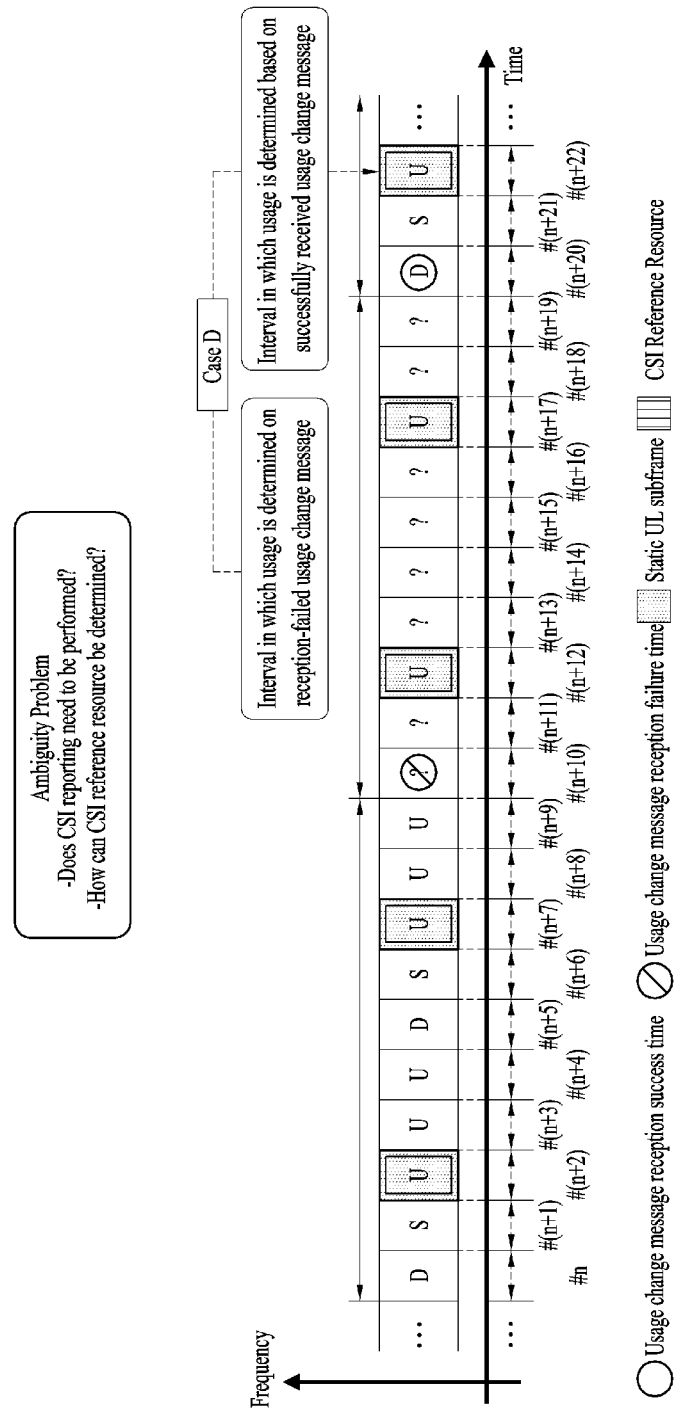

FIG. 9 shows one example of an ambiguity problem, which is caused by usage change message reception failure of a user equipment, of which UL-DL configuration assumption/rule is used to determine a location of a valid CSI-reference resource interconnected to CSI reporting at a specific time.

In FIG. 9, assume a situation that a periodic CSI reporting operation is configured (e.g., a period is set to 5 ms). And, it is assumed that the periodic CSI reporting is configured to be performed through a static UL resource. In addition, a legacy UL-DL configuration configured through an SIB signal is assumed to be UL-DL configuration #0 (i.e., DSUUUDSUUU). Moreover, it is also assumed that a base station transmits a usage change message to a user equipment based on a predefined period (i.e., 10 ms) and signal type. In this case, it is assumed that the user equipment does not successfully receive a usage change message transmitted in SF #(n+10). Thus, it is also assumed that usages of subframes from SF #(n+10), of which usage is determined by the corresponding usage change message, to SF #(n+19) are not clearly understood.

In the following description, a CSI reporting time and a location of a valid CSI-reference resource interconnected to CSI reporting are explained with reference to respective cases shown in FIG. 9 (a) to FIG. 9 (d).

Case A: It is explained with reference to FIG. 9 (a).
CSI reporting time: It is included in an interval in which usage is determined based on a successfully received usage change message.
Location of valid CSI-reference resource interconnected to CSI reporting: It is included in the interval in which the usage is determined based on the successfully received usage change message.
Case B: It is explained with reference to FIG. 9 (b).
CSI reporting time: It is included in an interval in which usage is determined based on a reception-failed usage change message.
Location of valid CSI-reference resource interconnected to CSI reporting: It is included in an interval in which usage is determined based on a successfully received usage change message.
Case C: It is explained with reference to FIG. 9 (c).
CSI reporting time: It is included in an interval in which usage is determined based on a reception-failed usage change message.
Location of valid CSI-reference resource interconnected to CSI reporting: It is included in the interval in which the usage is determined based on the reception-failed usage change message.
Case D: It is explained with reference to FIG. 9 (d).

CSI reporting time: It is included in an interval in which usage is determined based on a successfully received usage change message.
Location of valid CSI-reference resource interconnected to CSI reporting: It is included in an interval in which usage is determined based on a reception-failed usage change message.

CSI Reporting Configuration of UE Independent of Usage Change Message Reception

In each of the cases shown in FIG. 9 (i.e., Case A, Case B, Case C, and Case D), it needs to (re)define at least one of i) a configuration for determining a location of a valid CSI-reference resource interconnected to CSI reporting at a specific time regardless of success or failure of reception of a usage change message, ii) a configuration for conditions required to be considered as the valid CSI-reference resource interconnected to the CSI reporting at the specific time regardless of success or failure of the reception of the usage change message, and iii) a rule for an assumption with respect to a UL-DL configuration used for determining the location of the valid CSI-reference resource interconnected to the CSI reporting at the specific time regardless of success or failure of the reception of the usage change message, for stable CSI calculation and reporting in a user equipment. In particular, in each of the cases in FIG. 9 (i.e., Case A, Case B, Case C, and Case D), an ambiguity problem of whether CSI reporting should be (actually) performed and/or an ambiguity problem of how to determine the location of the valid CSI-reference resource interconnected to the CSI reporting at the specific time and/or an ambiguity problem of which UL-DL configuration assumption is used to determine the location of the valid CSI-reference resource and/or the like may occur due to the usage change message reception failure of the user equipment.

Moreover, in each of the cases in FIG. 9 (i.e., Case A, Case B, Case C, and Case D), the location of the valid CSI-reference resource interconnected to the CSI reporting at the specific time may be considered as one of i) a closest subframe corresponding to a subframe prior to a predetermined value (e.g., 4 ms or 5 ms) from a corresponding CSI reporting time and meeting a predefined condition of a valid CSI-reference resource at the same time, ii) a subframe corresponding to the subframe prior to the predetermined value from the corresponding CSI reporting time and meeting the predefined condition of the valid CSI-reference resource at the same time (e.g., aperiodic CSI reporting based on a CSI request field on a random access response (RAR) grant), and iii) a subframe corresponding to a subframe in which a CSI request field in a UL DCI format for triggering the corresponding CSI reporting is received and meeting the predefined condition of the valid CSI-reference resource at the same time (e.g., aperiodic CSI reporting).

Thus, for the above-mentioned cases, the present invention proposes a method of securing stable CSI calculation and reporting of a user equipment irrespective of success or failure of reception of usage change messages in case that a plurality of cells dynamically change usages of radio resources depending on their system load statuses and then inform the user equipment of related information through predefined formats of radio resource usage change messages.

In this case, for example, a rule of determining a location of a valid CSI-reference resource interconnected to CSI reporting at a specific time and/or a rule for conditions required to be considered as the valid CSI-reference resource and/or a rule for an assumption with respect to a UL-DL configuration (i.e., fallback operation with respect to a UL-DL configuration) used for determining the location of the valid CSI-reference resource and/or the like need to be (re)defined in order to secure the stable CSI calculation and reporting of the user equipment in each of the above-mentioned various cases (i.e., Case A, Case B, Case C, and Case D shown in FIG. 9).

Moreover, the location of the valid CSI-reference resource interconnected to the CSI reporting at the specific time may be considered as a closest subframe corresponding to a subframe prior to a predetermined value from a corresponding CSI reporting time and meeting a predefined condition of a valid CSI-reference resource at the same time, a subframe corresponding to the subframe prior to the predetermined value from the corresponding CSI reporting time and meeting the predefined condition of the valid CSI-reference resource at the same time, or a subframe corresponding to a subframe in which a CSI request field in a UL DCI format for triggering the corresponding CSI reporting is received and meeting the predefined condition of the valid CSI-reference resource at the same time.

The embodiments in the following description can be extensively applied to a case in which a periodic CSI reporting operation is configured and/or to a case in which an aperiodic CSI reporting operation is trigged. Moreover, the embodiments in the following description can be extensively applied to various transmission mode (TM) configurations (e.g., TMs 1-9 or TM 10) and/or to various CSI process configurations (e.g., 1 2, 3 or 4 CSI processes).

1$^{st}$ Embodiment

According to a 1$^{st}$ embodiment of the present invention, it may be configured that a location of a valid CSI-reference resource interconnected to CSI reporting at a specific time is determined based on an assumption with respect to a specific UL-DL configuration among UL-DL configurations listed below (i.e., Options #A to #D).

[Option #A] UL-DL configuration on SIB
[Option #B] UL-DL configuration of predefined reference UL HARQ timeline
[Option #C] UL-DL configuration of predefined reference DL HARQ timeline
[Option #D] UL-DL configuration (re)configured by usage change message Moreover, it is assumed in the following description that a condition of the valid CSI-reference resource is a downlink subframe and/or a special subframe (e.g., DwPTS). However, in the present embodiment, if a specific transmission mode (e.g., TM 10) is configured and/or the usage change message has the form of a physical layer signal (e.g., Explicit L1 Signaling of Reconfiguration by UE-Group-Common (e) PDCCH), it may be configured that the condition of the valid CSI-reference resource is not limited to the downlink subframe and/or the special subframe (e.g., it may be configured that both of the downlink subframe (and/or the special subframe (e.g., DwPTS)) and an uplink subframe (and/or a special subframe (e.g., UpPTS) are considered)).

It may be configured that an assumption with respect to a UL-DL configuration used for determining the location of the valid CSI-reference resource based on the present 1$^{st}$ embodiment is commonly applied to the Case A, Case B, Case C, and Case D mentioned with reference to FIG. 9. Alternatively, it may be configured that an assumption with respect to a different UL-DL configuration are independently applied to the above cases (e.g., in some cases (e.g., Case C), an assumption with respect to a different UL-DL configuration may be applied different from other cases (e.g., Case A, Case B and Case D)).

For the convenience of the explanation, in the following description, assume a case that a usage change message at a specific time is not successfully received in a situation that the location of the valid CSI-reference resource is determined based on a downlink subframe (and/or a special subframe (e.g., DwPTS)) in a UL-DL configuration (re) configured by the usage change message (i.e. Option #D). However, the present invention can be extensively applied to a case that the usage change message at the specific time is not successfully received in a situation that the assumption with respect to the UL-DL configuration used for determining the location of the valid CSI-reference resource is defined different from the above situation.

In particular, in the situation that i) the location of the valid CSI-reference resource is configured to be determined based on the downlink subframe (and/or the specific subframe (e.g., DwPTS)) in the UL-DL configuration (re) configured by the usage change message or that ii) the location of the valid CSI-reference resource is configured to be determined based on the downlink subframe (and/or the specific subframe (e.g., DwPTS)) in the UL-DL configuration of the predefined reference DL HARQ timeline, if the usage change message at the specific time is not successfully received, a subframe, which meets both of the assumption with respect to the UL-DL configuration used for determining the location of the valid CSI-reference resource and the condition of the valid CSI-reference resource in each of the cases, may be configured as embodiments 1-1 to 1-15 in the following description.

Embodiment 1-1

According to the present invention, if a location of a valid CSI-reference resource interconnected with CSI reporting at a specific time belongs to an interval in which usage is determined based on a reception-failed usage change message (i.e., Case C or Case D in FIG. 9), the location of the valid CSI-reference resource interconnected to the CSI reporting at the specific time can be determined in consideration of only downlink subframes and/or special subframes (e.g., DwPTS) in the UL-DL configuration on the SIB (i.e., [Option #A]).

Embodiment 1-2

According to the present invention, if a location of a valid CSI-reference resource interconnected with CSI reporting at a specific time belongs to an interval in which usage is determined based on a reception-failed usage change message (i.e., Case C or Case D in FIG. 9), the location of the valid CSI-reference resource interconnected to the CSI reporting at the specific time can be determined in consideration of only downlink subframes and/or special subframes (e.g., DwPTS) in the UL-DL configuration of the predefined reference UL HARQ timeline (i.e., [Option #B]).

Embodiment 1-3

According to the present invention, if a location of a valid CSI-reference resource interconnected with CSI reporting at a specific time belongs to an interval in which usage is determined based on a reception-failed usage change message (i.e., Case C or Case D in FIG. 9), the location of the valid CSI-reference resource interconnected to the CSI reporting at the specific time can be determined in consideration of only downlink subframes and/or special subframes (e.g., DwPTS) in the UL-DL configuration of the predefined reference DL HARQ timeline (i.e., [Option #C]).

Embodiment 1-4

According to the present invention, if a location of a valid CSI-reference resource interconnected with CSI reporting at a specific time belongs to an interval in which usage is determined based on a reception-failed usage change message (i.e., Case C or Case D in FIG. 9), the location of the valid CSI-reference resource interconnected to the CSI reporting at the specific time can be determined in consideration of only downlink subframes and/or special subframes (e.g., DwPTS) in a (predefined) static resource set.

Embodiment 1-5

According to the present invention, if a location of a valid CSI-reference resource interconnected with CSI reporting at a specific time belongs to an interval in which usage is determined based on a reception-failed usage change message (i.e., Case C or Case D in FIG. 9), the location of the valid CSI-reference resource interconnected to the CSI reporting at the specific time can be determined in consideration of only downlink subframes and/or special subframes (e.g., DwPTS) in an interval in which usage is determined based on a most recently and successfully received usage change message (i.e., [Option #D]).

Embodiment 1-6

According to the present invention, if a location of a valid CSI-reference resource interconnected with CSI reporting at a specific time belongs to an interval in which usage is determined based on a reception-failed usage change message (i.e., Case C or Case D in FIG. 9), the corresponding CSI reporting may be omitted or be performed according to a predefined specific value (e.g., RI/PMI/CQI).

It may be configured that a method of omitting CSI reporting according to the embodiment 1-6 is limitedly applied only if a base station is configured to receive feedback (e.g., ACK/NACK information) with respect to success or failure of reception of the usage change message from a user equipment. The reason for this is that if the base station is unable to obtain information on success or failure of reception of the usage change message from individual user equipments, it may cause a problem that the base station cannot be aware of whether the user equipment performs the CSI reporting and/or whether rate-matching is applied to uplink data mapping, due to piggyback of CSI on PUSCH.

Embodiment 1-7

According to the present invention, if a location of a valid CSI-reference resource interconnected with CSI reporting at a specific time belongs to an interval in which usage is determined based on a reception-failed usage change message (i.e., Case C or Case D in FIG. 9), the corresponding CSI reporting is performed according to a value of a most recently and successfully reported CSI.

In this case, the value of the most recently and successfully reported CSI may be defined as one of i) a value of latest CSI reporting based on the downlink subframes and/or the special subframes (e.g., DwPTS) in the interval in which the usage is determined based on the most recently and successfully received usage change message, ii) a value of latest CSI reporting based on the downlink subframes and/or special subframes (e.g., DwPTS) in the UL-DL configuration on the SIB, iii) a value of latest CSI reporting based on the downlink subframes and/or the special subframes (e.g., DwPTS) in the UL-DL configuration of the predefined reference UL HARQ timeline, iv) a value of latest CSI reporting based on the downlink subframes and/or the special subframes (e.g., DwPTS) in the UL-DL configuration of the predefined reference DL HARQ timeline, and v) a value of latest CSI reporting based on the downlink subframes and/or the special subframes (e.g., DwPTS) in the (predefined) static resource set.

Embodiment 1-8

According to the present invention, if a location of a valid CSI-reference resource interconnected with CSI reporting at a specific time belongs to an interval in which usage is determined based on a reception-failed usage change message (i.e., Case C or Case D in FIG. 9), the corresponding CSI reporting is performed (re)using the valid CSI-reference resource in most recently and successfully performed CSI reporting.

For instance, the most recently and successfully performed CSI reporting may be defined as most recent CSI reporting based on the downlink subframes (and/or the special subframes (e.g., DwPTS)) in the interval in which the usage is determined based on the most recently and successfully received usage change message, most recent CSI reporting based on the downlink subframes (and/or the special subframes (e.g., DwPTS)) in the UL-DL configuration on the SIB, most recent CSI reporting based on the downlink subframes (and/or the special subframes (e.g., DwPTS)) in the UL-DL configurations of the predefined reference UL HARQ timeline, most recent CSI reporting based on the downlink subframes (and/or the special subframes (e.g., DwPTS)) in the UL-DL configurations of the predefined reference DL HARQ timeline, most recent CSI reporting based on the downlink subframes (and/or the special subframes (e.g., DwPTS)) in the (predefined) static resource set, and the like.

Moreover, if the embodiment 1-8 is applied in the situation that TM 10 is configured, the value of the most recently and successfully performed CSI reporting may be different from a value of CSI reporting at (or after) the specific time, which (re)uses the valid CSI-reference resource of the most recently and successfully performed CSI reporting.

In particular, the value of CSI reporting at (or after) the specific time (re)using the valid CSI-reference resource of the most recently and successfully performed CSI reporting may be different from the value of the most recently and successfully performed CSI reporting since it corresponds to a result of interpolation of channel/interference of the corresponding valid CSI-reference resource (i.e., the valid CSI-reference resource in the most recently and successfully performed CSI reporting) on the basis of measurement information additionally obtained after the valid CSI-reference resource in the most recently and successfully performed CSI reporting.

Embodiment 1-9

According to the present invention, if a location of a valid CSI-reference resource interconnected with CSI reporting at a specific time belongs to an interval in which usage is determined based on a reception-failed usage change message (i.e., Case C or Case D in FIG. 9), it may be considered that valid CSI-reference resources do not exist in the interval in which the usage is determined based on the reception-failed usage change message.

For example, if the embodiment 1-9 is applied, the location of the valid CSI-reference resource interconnected to the CSI reporting at the specific time may be determined in consideration of only one of i) the downlink subframes and/or the special subframes (e.g., DwPTS) in the interval in which the usage is determined based on the most recently and successfully received usage change message, ii) downlink subframes and/or special subframes (e.g., DwPTS) in the UL-DL configuration on the SIB and in the interval in which the usage is determined based on the most recently and successfully received usage change message at the same time, iii) downlink subframes and/or special subframes (e.g., DwPTS) in the UL-DL configuration of the predefined reference UL HARQ timeline and in the interval in which the usage is determined based on the most recently and successfully received usage change message at the same time, iv) downlink subframes and/or special subframes (e.g., DwPTS) in the UL-DL configuration of the predefined reference DL HARQ timeline and in the interval in which the usage is determined based on the most recently and successfully received usage change message at the same time, and v) downlink subframes and/or special subframes (e.g., DwPTS) in the (predefined) static resource set and in the interval in which the usage is determined based on the most recently and successfully received usage change message at the same time.

In addition, the embodiment 1-9 may be applied in a manner of being combined with one of the above-mentioned embodiments 1-6, 1-7 and 1-8.

Embodiment 1-10

According to the present invention, if a location of a valid CSI-reference resource interconnected with CSI reporting at a specific time belongs to an interval in which usage is determined based on a reception-failed usage change message (i.e., Case C or Case D in FIG. 9), while the above-mentioned embodiments 1-1 to 1-9 are applied, it may be configured that remaining subframes except subframes meeting the predefined condition of the valid CSI-reference resource are considered as non-valid CSI-reference resources (e.g., uplink subframe and/or UpPTS in a special subframe).

Embodiment 1-11

According to the present invention, if a location of a valid CSI-reference resource interconnected with CSI reporting at a specific time belongs to an interval in which usage is determined based on a successfully received usage change message (i.e., Case A or Case B), the location of the valid CSI-reference resource interconnected to the CSI reporting at the specific time is determined in consideration of only downlink subframes and/or special subframes (e.g., DwPTS) in the interval in which the usage is determined based on the usage change message.

Embodiment 1-12

According to the present invention, if a location of a valid CSI-reference resource interconnected with CSI reporting at a specific time belongs to an interval in which usage is determined based on a successfully received usage change message (i.e., Case A or Case B), one of the above-mentioned embodiments 1-1 to 1-4 may be applied. Details are described with reference to the embodiments 1-1 to 1-4.

Embodiment 1-13

According to the present invention, if a CSI reporting time belongs to an interval in which usage is determined based on a reception-failed usage change message, a specific embodiment among the above-mentioned embodiments 1-1 to 1-5 can be applied. Details are described with reference to the embodiments 1-1 to 1-5.

In this case, the location of the valid CSI-reference resource interconnected to the CSI reporting at the corresponding time may be configured to be determined in consideration of only one of i) the downlink subframes and/or the special subframes (e.g., DwPTS) in the UL-DL configuration on the SIB, ii) the downlink subframes and/or the special subframes (e.g., DwPTS) in the UL-DL configuration of the predefined reference UL HARQ timeline, iii) the downlink subframes and/or the special subframes (e.g., DwPTS) in the UL-DL configuration of the predefined reference DL HARQ timeline, iv) the downlink subframes and/or the special subframes (e.g., DwPTS) in the (predefined) static resource set, and v) the downlink subframes and/or the special subframes (e.g., DwPTS) in the interval in which the usage is determined based on the most recently and successfully received usage change message.

Moreover, if the location of the valid CSI-reference resource interconnected to the CSI reporting at the corresponding time is determined based on one among the above-mentioned embodiments 1-1 to 1-4, it may be useful in i) the case that communication is restrictively performed on the downlink subframes and/or the special subframes (e.g., DwPTS) in the UL-DL configuration on the SIB in the interval in which the usage is determined based on the reception-failed usage change message, ii) the case that communication is restrictively performed on only the downlink subframes and/or the special subframes (e.g., DwPTS) in the UL-DL configuration of the predefined reference UL HARQ timeline, iii) the case that communication is restrictively performed on only the downlink subframes and/or the special subframes (e.g., DwPTS) in the UL-DL configuration of the predefined reference DL HARQ timeline, or iv) the case that communication is restrictively performed on only the downlink subframes and/or the special subframes (e.g., DwPTS) in the (predefined) static resource set.

In particular, the reason for it is that the base station can obtain a CSI value based on the valid CSI-reference resource having the same or similar interference characteristic as downlink communication actually performed on the interval in which the usage is determined based on the usage change message which the user equipment fails in receiving.

Embodiment 1-14

According to the present invention, if a CSI reporting time belongs to an interval in which usage is determined based on a reception-failed usage change message, a specific embodiment among the above-mentioned embodiments 1-6 to 1-9 can be applied. Details are described with reference to the embodiments 1-6 to 1-9.

For example, if the CSI reporting time belongs to the interval in which the usage is determined based on the reception-failed usage change message, i) the corresponding CSI reporting is omitted, ii) the corresponding CSI reporting is configured to be performed in accordance with a predefined specific value (e.g., RI/PMI/CQI), iii) the corresponding CSI reporting is configured to be performed in accordance with the most recently and successfully reported CSI value, iv) the corresponding CSI reporting is configured to be performed (re)using the valid CSI-reference resource of the most recently and successfully performed CSI reporting, or v) it may be considered that the valid CSI-reference resources do not exist in the interval in which the usage is determined based on the reception-failed usage change message.

Aperiodic CSI Reporting in Case of Usage Change Message Reception Failure

The present invention proposes a method of stably securing aperiodic CSI reporting based on a CSI request field on a random access response (RAR) grant in case that a usage change message at a specific time is not successfully received in a situation that a location of a valid CSI-reference resource is configured to be determined based on a downlink subframe and/or a specific subframe (e.g., DwPTS) in a UL-DL configuration (re)configured by the usage change message (i.e., Option #D). However, the present invention can be extensively applied to a case that the usage change message at the specific time is not successfully received in a situation that an assumption with respect to a UL-DL configuration used for determining the location of the valid CSI-reference resource is defined differently from the above situation (e.g., Option #A, Option #B and Option #C).

Moreover, the legacy aperiodic CSI reporting based on the CSI request field on the RAR grant is performed based on a subframe corresponding to a subframe prior to a predetermined value (e.g., 4 ms or 5 ms) from a corresponding CSI reporting time and meeting a predefined condition of the valid CSI-reference resource at the same time. However, since usage of a subframe, of which usage is determined by the usage change message, is not clearly understood due to failure of reception of the corresponding usage change message, an ambiguity problem of whether the corresponding aperiodic CSI reporting should be (actually) performed, an ambiguity problem of how to determine the location of the valid CSI-reference resource interconnected to the corresponding aperiodic CSI reporting, or an ambiguity problem of which UL-DL configuration assumption is used to determine the location of the valid CSI-reference resource of the corresponding aperiodic CSI reporting may occur.

Thus, to secure the aperiodic CSI reporting based on the CSI request field on the RAR grant stably, an assumption with respect to a UL-DL configuration used for determining the location of the valid CSI-reference resource (interconnected to the corresponding aperiodic CSI reporting) and a subframe meeting the condition of the valid CSI-reference resource may be configured as embodiments 1-15 to 1-18 in the following description.

Embodiment 1-15

According to the present invention, aperiodic CSI reporting based on a CSI request field on an RAR grant may be configured to be performed based on i) a closest subframe corresponding to a subframe prior to a predetermined value from a corresponding aperiodic CSI reporting time and meeting a predefined condition of a valid CSI-reference resource at the same time or ii) a subframe corresponding to a subframe in which the CSI request field on the RAR grant for triggering the corresponding aperiodic CSI reporting is received and meeting the predefined condition of the valid CSI-reference resource at the same time.

In this case, one of the embodiments 1-1 to 1-5 can be applied to an assumption with respect to a UL-DL configuration used for determining a location of the valid CSI-reference resource interconnected to the corresponding aperiodic CSI reporting and the condition of the valid CSI-reference resource. Details are described with reference to the embodiments 1-1 to 1-5.

For instance, the location of the valid CSI-reference resource interconnected to the aperiodic CSI reporting may be configured to be determined in consideration of only one of i) the downlink subframes and/or the special subframes (e.g., DwPTS) in the UL-DL configuration on the SIB, ii) the downlink subframes and/or the special subframes (e.g., DwPTS) in the UL-DL configuration of the predefined reference UL HARQ timeline, iii) the downlink subframes and/or the special subframes (e.g., DwPTS) in the UL-DL configuration of the predefined reference DL HARQ timeline, iv) the downlink subframes and/or the special subframes (e.g., DwPTS) in the (predefined) static resource set, and v) the downlink subframes and/or the special subframes (e.g., DwPTS) in the interval in which the usage is determined based on the most recently and successively received usage change message.

Embodiment 1-16

According to the present invention, one of the above-mentioned embodiments 1-6 to 1-9 can be applied. For instance, if a location of a valid CSI-reference resource interconnected to aperiodic CSI reporting based on a CSI request field on an RAR grant belongs to an interval in which usage is determined based on a reception-failed usage change message, i) the corresponding aperiodic CSI reporting is omitted, ii) the corresponding aperiodic CSI reporting is configured to be performed in accordance with a predefined specific value (e.g., RI/PMI/CQI), iii) the corresponding aperiodic CSI reporting is configured to be performed in accordance with a most recently and successfully reported aperiodic CSI value, iv) the corresponding aperiodic CSI reporting is configured to be performed (re)using the valid CSI-reference resource of most recently and successfully performed aperiodic CSI reporting, or v) it may be considered that the valid CSI-reference resources do not exist in the interval in which the usage is determined based on the reception-failed usage change message.

Embodiment 1-17

According to the present invention, it may be configured that aperiodic CSI reporting based on a CSI request field on an RAR grant is performed based on a subframe corresponding to a subframe prior to a predetermined value from a corresponding aperiodic CSI reporting time and meeting a predefined condition of a valid CSI-reference resource at the same time.

Moreover, according to the embodiment 1-17, if the subframe prior to the predetermined value from the corresponding aperiodic CSI reporting time does not meet the (predefined) condition of the valid CSI-reference resource, it may be configured that the corresponding aperiodic CSI reporting is omitted.

In this case, one of the embodiments 1-1 to 1-5 can be applied to an assumption with respect to a UL-DL configuration used for determining a location of the valid CSI-reference resource interconnected to the corresponding aperiodic CSI reporting and the condition of the valid CSI-reference resource. Details are described with reference to the embodiments 1-1 to 1-5.

Particularly, (the location of) the valid CSI-reference resource interconnected to the corresponding aperiodic CSI reporting may be configured to be determined in consideration of only one of i) the downlink subframes and/or the special subframes (e.g., DwPTS) in the UL-DL configuration on the SIB, ii) the downlink subframes and/or the special subframes (e.g., DwPTS) in the UL-DL configuration of the predefined reference UL HARQ timeline, iii) the downlink subframes and/or the special subframes (e.g., DwPTS) in the UL-DL configuration of the predefined reference DL HARQ timeline, iv) the downlink subframes and/or the special subframes (e.g., DwPTS) in the (pre-defined) static resource set, and v) the downlink subframes and/or the special subframes (e.g., DwPTS) in the interval in which the usage is determined based on the most recently and successively received usage change message.

Embodiment 1-18

According to the present invention, i) at least one of the above-mentioned embodiments 1-15 to 1-17 may be restrictively applied when aperiodic CSI reporting based on a CSI request field on a RAR grant corresponds to some cases (i.e., some of Cases A, B, C and D) shown in FIG. 9 or ii) at least one of the above-mentioned embodiments 1-15 to 1-17 may be applied to all the cases (i.e., all of Cases A, B, C and D) shown in FIG. 9.

2$^{nd}$ Embodiment

According to a 2$^{nd}$ embodiment of the present invention, if a location of a valid CSI-reference resource is determined/searched for based on predefined configurations/rules, it may be configured to be performed within a predefined time window only. For instance, if the location of the valid CSI-reference resource is determined/searched for based on at least one of i) a predefined configuration of determining the location of the valid CSI-reference resource, ii) a predefined configuration for conditions required to be considered as the valid CSI-reference resource, and iii) a predefined configuration for an assumption with respect to a UL-DL configuration (or resource usage configuration information) used for determining the location of the valid CSI-reference resource, it may be configured to be performed within the predefined time window only.

Moreover, if the LTE system (re)uses a specific channel (e.g., unlicensed band) on WiFi band in a manner of occupying the specific channel (based on sensing) aperiodically (or by irregular interval (TxOP) length), a location of a valid CSI-reference resource (on the unlicensed band) in CSI reporting related to the unlicensed band reported at a specific time is set to a point in the far past. Therefore, the above-mentioned method can be used to prevent inaccurate (or outdated) CSI reporting from being performed. In this case, for example, it may be defined that the valid CSI-reference resource related to the unlicensed band restrictively exists in only TxOP interval (e.g., DL SF) configured based on sensing. And, a user equipment searches for the valid CSI-reference resource within the corresponding interval.

In addition, the above-mentioned method can be extensively applied to non-fallback mode as well as to fallback mode.

In this case, for example, a starting point of time window (hereinafter referred to as "TW_START") may be set to one of i) a CSI reporting time, ii) a subframe prior to a predetermined value (e.g., 4 ms or 5 ms) from the CSI reporting time, iii) a subframe in which a CSI request field for triggering CSI reporting is received, iv) a subframe corresponding to the subframe prior to the predetermined value from the CSI reporting time and meeting a predefined condition of the valid CSI-reference resource at the same time, v) a closest subframe corresponding to the subframe prior to the predetermined value from the CSI reporting time and meeting the predefined condition of the valid CSI-reference resource at the same time, vi) a subframe corresponding to the subframe in which the CSI request field for triggering the CSI reporting is received and meeting the predefined condition of the valid CSI-reference resource at the same time.

Moreover, a time window size (hereinafter referred to as "TW_SIZE") determines an (total) interval for searching for/deriving the location of the valid CSI-reference resource interconnected to CSI reporting at a specific time from a predefined starting point of time window. Thus, according to the above-mentioned starting point of time window (i.e., "TW_START") and time window size (i.e., "TW_SIZE"), the location of the valid CSI-reference resource interconnected to the CSI reporting at the specific time is searched for/derived in "interval from TW_START to (TW_START-TW_SIZE)".

Furthermore, a base station may be configured to inform a user equipment of information on the starting point of time window and/or information on the time window size through a predefined signal (e.g., physical layer signal or high layer signal). Alternatively, the user equipment may be configured to implicitly understand the starting point of time window and/or the time window size (e.g., it may be configured that the time window size is implicitly defined as from the starting point of time window to a first subframe of a previous closest radio frame).

3$^{rd}$ Embodiment

It may be configured that at least one of methods/embodiments/configurations disclosed in the 1$^{st}$ or 2$^{nd}$ embodiment of the present invention are restrictively applied to only some predefined cases or some parameters. According to a 3$^{rd}$ embodiment, at least one of methods/embodiments/configurations disclosed in the 1$^{st}$ or 2$^{nd}$ embodiment can be applied as follows.

The embodiments of the present invention may be restrictively applied only if a specific CSI reporting method (e.g., periodic CSI reporting or aperiodic CSI reporting) is configured or triggered.

The embodiments of the present invention may be restrictively applied only if a specific CSI reporting mode (e.g., PUCCH reporting mode corresponding to periodic CSI reporting or PUSCH reporting mode corresponding to aperiodic CSI reporting) is configured. In this case, the PUCCH reporting mode may include, for example, Mode 1-0, Mode 1-1, Mode 2-0, and Mode 2-1 and the PUSCH reporting mode may include, for example, Mode 1-2, Mode 2-0, Mode 2-2, Mode 3-0, and Mode 3-1.

The embodiments of the present invention may be restrictively applied only if a condition of a valid CSI-reference resource is set as a downlink subframe and/or a special subframe (e.g., DwPTS) except an MBSFN subframe.

The embodiments of the present invention may be restrictively applied only if a specific transmission mode (TM) is configured and/or only if a specific special subframe configuration is designated.

The embodiments of the present invention may be restrictively applied depending on presence or non-presence of transmission of a predefined reference signal (e.g., CRS or CSI-RS) in a downlink subframe and/or a special subframe (e.g., DwPTS) in a flexible resource set. In particular, the embodiments may be restrictively applied depending on whether transmission availability of a specific control channel (e.g., PDCCH) or configuration availability of a specific transmission mode (TM) is determined.

The embodiments of the present invention may be restrictively applied depending on a type of a transmission mode (TM) configuration applied to the downlink subframe and/or the special subframe (e.g., DwPTS) in the flexible resource set. For instance, the embodiments may be restrictively applied only if a transmission mode (e.g., TM 4) that requires CRS-based downlink data channel (PDSCH) decoding is configured.

The embodiments of the present invention may be restrictively applied only if a specific number of CSI processes are configured.

The embodiments of the present invention may be restrictively applied to only a specific system environment (e.g., FDD system or TDD system).

The embodiments of the present invention may be restrictively applied to only RRC CONNECTED mode or IDLE mode of a user equipment.

The embodiments of the present invention may be restrictively applied only if dynamic change mode of radio resource usage is configured.

The embodiments of the present invention may be restrictively applied only if a base station is configured to receive feedback with respect to success or failure of reception of a usage change message from a user equipment.

The embodiments of the present invention may be restrictively applied to only a specific component carrier (CC) or a specific cell (e.g., PCell or SCell) having dynamic change mode of radio resource usage configured therein in an environment to which a carrier aggregation (CA) scheme is applied.

It may be able to implement the above-mentioned embodiments not only independently but also as form of combining/merging at least one of the above-mentioned embodiments together.

Moreover, information on the above-mentioned rules/configurations/embodiments of the present invention, information on whether to apply the corresponding rules/configurations/embodiments or the like may be informed a user equipment by a base station through a predefined signal (e.g., physical layer or high layer signal).

Moreover, the above-mentioned embodiments of the present invention can be extensively applied to at least one of independent CSI reporting configurations, which includes i) CSI reporting mode, ii) CSI reporting method and iii) periodic CSI reporting related period and subframe offset parameter, defined in in each of resource sets (e.g., static (downlink) resource set or flexible (downlink) resource set) having different interference characteristics. In this case, examples of the CSI reporting mode may include PUCCH reporting mode corresponding to periodic CSI reporting (i.e., Mode 1-0, Mode 1-1, Mode 2-0, Mode 2-1) and PUSCH reporting mode corresponding aperiodic reporting mode (i.e., Mode 1-2, Mode 2-0, Mode 2-2, Mode 3-0, Mode 3-1). Moreover, examples of the CSI reporting method may include periodic CSI reporting and aperiodic CSI reporting. In addition, example of the periodic CSI reporting related period and subframe offset parameter may include resource-Specific CSI Measurement and restricted CSI Measurement.

Furthermore, the condition of the valid CSI-reference resource of CSI reporting interconnected to a specific resource set according to the embodiment of the present invention may be (re)interpreted/(re)limited as/to i) downlink subframes and/or special subframes (e.g., DwPTS) in the corresponding specific resource set or ii) subframes included in the corresponding specific resource set among downlink subframes and/or special subframes (e.g., DwPTS) on the assumption with respect to the UL-DL configuration used for determining the location of the valid CSI-reference resource.

In addition, the above-mentioned embodiments of the present invention can be extensively applied to the case that the LTE system (re)uses a specific channel (e.g., unlicensed band) on WiFi band in a manner of occupying the specific channel (based on sensing) aperiodically (or by irregular interval (TxOP) length).

Figure 10:
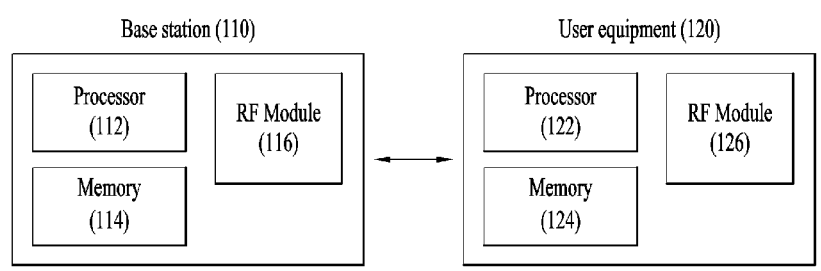
FIG. 10 is a diagram for examples of a base station and a user equipment applicable to an embodiment of the present invention.

FIG. 10 a diagram for examples of a base station and a user equipment applicable to an embodiment of the present invention.

If a relay node is included in a wireless communication system, a communication in backhaul link is performed between a base station and the relay node and a communication in access link is performed between the relay node and a user equipment. Therefore, the base station or user equipment shown in the drawing can be substituted with the relay node in some cases.

Referring to FIG. 10, a wireless communication system includes a base station BS 110 and a user equipment UE 120. The base station 110 includes a processor 112, a memory 114 and an RF (radio frequency) unit 116. The processor 112 can be configured to implement the procedures and/or methods proposed by the present invention. The memory 114 is connected to the processor 112 and stores various kinds of informations related to operations of the processor 112. The RF unit 116 is connected to the processor 112 and transmits and/or receives radio or wireless signals. The user equipment 120 includes a processor 122, a memory 124 and an RF unit 126. The processor 122 can be configured to implement the procedures and/or methods proposed by the present invention. The memory 124 is connected to the processor 122 and stores various kinds of informations related to operations of the processor 122. The RF unit 126 is connected to the processor 122 and transmits and/or receives radio or wireless signals. The base station 110 and/or the user equipment 120 can have a single antenna or multiple antennas.

The above-described embodiments may correspond to combinations of elements and features of the present invention in prescribed forms. And, it may be able to consider that the respective elements or features may be selective unless they are explicitly mentioned. Each of the elements or features may be implemented in a form failing to be combined with other elements or features. Moreover, it may be able to implement an embodiment of the present invention by combining elements and/or features together in part. A sequence of operations explained for each embodiment of the present invention may be modified. Some configurations or features of one embodiment may be included in another embodiment or can be substituted for corresponding configurations or features of another embodiment. And, it is apparently understandable that a new embodiment may be configured by combining claims failing to have relation of explicit citation in the appended claims together or may be included as new claims by amendment after filing an application.

In this disclosure, a specific operation explained as performed by a base station may be performed by an upper node of the base station in some cases. In particular, in a network constructed with a plurality of network nodes including a base station, it is apparent that various operations performed for communication with a user equipment can be performed by a base station or other networks except the base station. Moreover, in this document, 'base station (BS)' may be substituted with such a terminology as a fixed station, a Node B, an eNode B (eNB), an access point (AP) and the like.

Embodiments according to the present invention can be implemented using various means. For instance, embodiments of the present invention can be implemented using hardware, firmware, software and/or any combinations thereof. In case of the implementation by hardware, one embodiment of the present invention can be implemented by at least one selected from the group consisting of ASICs (application specific integrated circuits), DSPs (digital signal processors), DSPDs (digital signal processing devices), PLDs (programmable logic devices), FPGAs (field programmable gate arrays), processor, controller, microcontroller, microprocessor and the like.

In case of the implementation by firmware or software, one embodiment of the present invention can be implemented by modules, procedures, and/or functions for performing the above-explained functions or operations. Software code is stored in a memory unit and is then drivable by a processor.

The memory unit is provided within or outside the processor to exchange data with the processor through the various well-known means.

It will be apparent to those skilled in the art that the present invention may be embodied in other specific forms without departing from the spirit and essential characteristics of the invention. Thus, the above embodiments should be considered in all respects as exemplary and not restrictive. The scope of the present invention should be determined by reasonable interpretation of the appended claims and the present invention covers the modifications and variations of this invention that come within the scope of the appended claims and their equivalents.

INDUSTRIAL APPLICABILITY

Although a method of measuring a channel state in a wireless communication system supporting a change of usage of a radio resource and apparatus therefor are mainly described with reference to the examples of applying to 3GPP LTE system, as mentioned in the foregoing description, the present invention is applicable to various kinds of wireless communication systems as well as to the 3GPP LTE system.

What is claimed is:

1. A method of estimating a channel state by a user equipment in a wireless communication system, the method comprising:
   monitoring a reconfiguration message transmitted from a base station for a dynamic change of a radio resource usage;
   transmitting, to a base station, information on whether the reconfiguration message is successfully decoded or not; and
   measuring Channel State Information (CSI) from a CSI-reference resource within a time interval,
   wherein, based on the reconfiguration message i-s being unsuccessfully decoded based on a cyclic redundancy check on the reconfiguration message determined as False:
      based on the reconfiguration message being for the time interval of the CSI-reference resource, the CSI-reference resource is determined based on an uplink-downlink (UL-DL) configuration on a system information block (SIB), and
      based on the reconfiguration message being for a report time of the CSI, the CSI is not reported to the base station, and
   wherein, based on the reconfiguration message being successfully decoded based on the cyclic redundancy check on the reconfiguration message determined as success, the CSI-reference resource is determined based on a UL-DL configuration configured by the reconfiguration message.

2. A user equipment (UE) in a wireless communication system, the user equipment comprising:
   a radio frequency unit; and
   a processor configured to:
      monitor a reconfiguration message transmitted from a base station for a dynamic change of a radio resource usage;
      transmit, to a base station, information on whether the reconfiguration message is successfully decoded or not; and
      measure a Channel State Information (CSI) from a CSI-reference resource within a time interval;
   wherein, based on the reconfiguration message being unsuccessfully decoded based on a cyclic redundancy check on the reconfiguration message determined as False:
      based on the reconfiguration message being for the time interval of the CSI-reference resource, the CSI-reference resource is determined based on Hall an uplink-downlink (UL-DL) configuration on a system information block (SIB), and
      based on the reconfiguration message being for a report time of the CSI, the CSI is not reported to the base station, and
   wherein, based on the reconfiguration message being successfully decoded based on the cyclic redundancy check on the reconfiguration message determined as success, the CSI-reference resource is determined based on a UL-DL configuration configured by the reconfiguration message.

3. The method of claim 1, wherein
based on the reconfiguration message being unsuccessfully decoded, the CSI is measured from a first CSI-reference resource based on the system information block, and
based on the reconfiguration message being successfully decoded, the CSI is measured from a second CSI-reference resource based on the reconfiguration message.

4. The UE of claim 2, wherein
based on the reconfiguration message being unsuccessfully decoded, the CSI is measured from a first CSI-reference resource based on the system information block, and based on the reconfiguration message being successfully decoded, the CSI is measured from a second CSI-reference resource based on the reconfiguration message.

5. The method of claim 3,
wherein the first CSI-reference resource corresponds to at least one of a downlink subframe and a special subframe on the system information block, and
wherein the second CSI-reference resource corresponds to at least one of a downlink subframe and a special subframe on the reconfiguration message.

6. The UE of claim 4,
wherein the first CSI-reference resource corresponds to at least one of a downlink subframe and a special subframe on the system information block, and
wherein the second CSI-reference resource CSI corresponds to at least one of a downlink subframe and a special subframe on the reconfiguration.

7. The method of claim 1, wherein a window size of the time interval is defined as from a subframe for a starting point to a first subframe of a next radio frame.

8. The UE of claim 2, wherein a window size of the time interval is defined as from a subframe for a starting point to a first subframe of a next radio frame.

* * * * *